United States Patent
Jen-La Plante et al.

(10) Patent No.: US 11,549,058 B2
(45) Date of Patent: Jan. 10, 2023

(54) SMALL MOLECULE PASSIVATION OF QUANTUM DOTS FOR INCREASED QUANTUM YIELD

(71) Applicant: Nanosys, Inc., Milpitas, CA (US)

(72) Inventors: Ilan Jen-La Plante, San Jose, CA (US); Yeewah Annie Chow, San Jose, CA (US); John J. Curley, San Francisco, CA (US); Wenzhou Guo, San Jose, CA (US); Alexander Tu, San Jose, CA (US); Chunming Wang, Milpitas, CA (US)

(73) Assignee: Nanosys, Inc., Milpitas, CA (US)

( * ) Notice: Subject to any disclaimer, the term of this patent is extended or adjusted under 35 U.S.C. 154(b) by 533 days.

(21) Appl. No.: 16/751,632

(22) Filed: Jan. 24, 2020

(65) Prior Publication Data
US 2020/0239769 A1   Jul. 30, 2020

Related U.S. Application Data

(60) Provisional application No. 62/796,276, filed on Jan. 24, 2019.

(51) Int. Cl.
C09K 11/70 (2006.01)
C09K 11/02 (2006.01)
(Continued)

(52) U.S. Cl.
CPC ............ *C09K 11/70* (2013.01); *C09K 11/025* (2013.01); *H01L 33/0083* (2013.01);
(Continued)

(58) Field of Classification Search
None
See application file for complete search history.

(56) References Cited

U.S. PATENT DOCUMENTS 6,319,426 B1 * 11/2001 Bawendi ............... B82Y 15/00
428/407
2018/0044586 A1   2/2018 Kwon et al.
(Continued)

FOREIGN PATENT DOCUMENTS

WO   WO2018/178137 A1   10/2018

OTHER PUBLICATIONS

Gao, Y. and Peng, X., "Photogenerated Excitons in Plain Core CdSe Nanocrystals with Unity Radiative Decay in Single Channel: The Effects of Surface and Ligands," *J Am. Chem. Soc.*, 137:4230-4235 (2015), American Chemical Society.
(Continued)

*Primary Examiner* — Evren Seven
(74) *Attorney, Agent, or Firm* — Sterne, Kessler, Goldstein & Fox P.L.L.C.

(57) ABSTRACT

This disclosure pertains to the field of nanotechnology. The disclosure provides nanostructure compositions comprising (a) at least one population of nanostructures; (b) at least one metal halide bound to the surface of the nanostructures; and (c) at least one metal carboxylate bound to the surface of the nanostructures. The nanostructure compositions have high quantum yield, narrow emission peak width, tunable emission wavelength, and colloidal stability. Also provided are methods of preparing the nanostructure compositions. And, nanostructure films and molded articles comprising the nanostructure compositions are also provided.

19 Claims, 7 Drawing Sheets

(51) Int. Cl.
*H01L 33/00* (2010.01)
*H01L 33/06* (2010.01)
*B82Y 20/00* (2011.01)
*B82Y 40/00* (2011.01)

(52) U.S. Cl.
CPC .............. *H01L 33/06* (2013.01); *B82Y 20/00* (2013.01); *B82Y 40/00* (2013.01)

(56) References Cited

U.S. PATENT DOCUMENTS

2018/0094190 A1   4/2018   Kim et al.
2019/0006556 A1   1/2019   Park et al.

OTHER PUBLICATIONS

International Search Report and Written Opinion of the International Searching Authority directed to related International Patent Application No. PCT/US2020/014469, dated Mar. 27, 2020; 13 pages, International Searching Authority of WIPO.

Koscher, B.A., Swabeck, J.K., Bronstein, N.D., and Alivisatos, A.P., Essentially Trap-Free $CsPbBr_3$ Colloidal Nanocrystals by Postsynthetic Thiocyanate Surface Treatment, *J Am. Chem. Soc.*, 139, 6566-6569 (2017), American Chemical Society.

Blackburn, J.L., et al., "Electron and Hole Transfer from Indium Phosphide Quantum Dots," *J Phys Chem B* 109(7):2625-2631, American Chemical Society, United States (2005).

Chibli, H., et al., "Cytotoxicity of InP/ZnS quantum dots related to reactive oxygen species generation," *Nanoscale* 3(6):2552-2559, Royal Society of Chemistry, United Kingdom (2011).

Selmarten, D., et al., "Quenching of Semiconductor Quantum Dot Photoluminescence by a π-Conjugated Polymer," *J Phys Chem B* 109(33):15927-15932, American Chemical Society, United States (2005).

Wang, A., et al., "Bright, efficient, and color-stable violet ZnSe-based quantum dot light-emitting diodes," *Nanoscale* 7(7):2951-2959, Royal Society of Chemistry, United Kingdom (2015).

\* cited by examiner

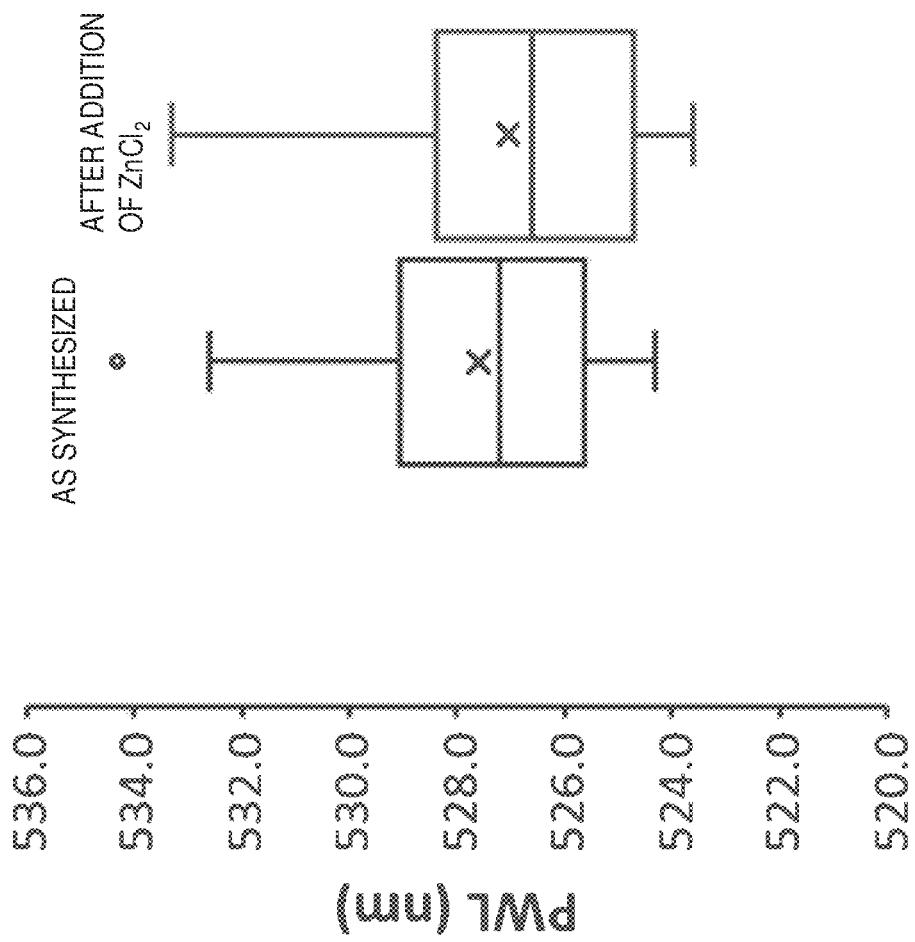

SMALL MOLECULE PASSIVATION OF QUANTUM DOTS FOR INCREASED QUANTUM YIELD

BACKGROUND OF THE INVENTION

Field of the Invention

This disclosure pertains to the field of nanotechnology. The disclosure provides nanostructure compositions comprising (a) at least one population of nanostructures; (b) at least one metal halide bound to the surface of the nanostructures; and (c) at least one metal carboxylate bound to the surface of the nanostructures. The nanostructure compositions have high quantum yield, narrow emission peak width, tunable emission wavelength, and colloidal stability. Also provided are methods of preparing the nanostructure compositions. And, nanostructure films and molded articles comprising the nanostructure compositions are also provided.

Background Art

Semiconductor nanostructures can be incorporated into a variety of electronic and optical devices. The electrical and optical properties of such nanostructures vary, e.g., depending on their composition, shape, and size. For example, size-tunable properties of semiconductor nanoparticles are of great interest for applications such as light emitting diodes (LEDs) and liquid crystal displays (LCDs). Highly luminescent nanostructures are particularly desirable for such applications.

To exploit the full potential of nanostructures in applications such as LEDs and LCDs, the nanostructures need to simultaneously meet five criteria: narrow and symmetric emission spectra, high photoluminescence quantum yields (PLQYs), high optical stability, eco-friendly materials, and low-cost methods for mass production. Most previous studies on highly emissive and color-tunable quantum dots have concentrated on materials containing cadmium, mercury, or lead. Wang, A., et al., *Nanoscale* 7:2951-2959 (2015). But, there are increasing concerns that toxic materials such as cadmium, mercury, or lead would pose serious threats to human health and the environment and the European Union's Restriction of Hazardous Substances rules ban any consumer electronics containing more than trace amounts of these materials. Therefore, there is a need to produce materials that are free of cadmium, mercury, and lead for the production of LEDs and LCDs.

Cadmium-free quantum dots based on indium phosphide are inherently less stable than the prototypic cadmium selenide quantum dots. The higher valence and conduction band energy levels make InP quantum dots more susceptible to photooxidation by electron transfer from an excited quantum dot to oxygen, as well as more susceptible to photoluminescence quenching by electron-donating agents such as amines or thiols where hole trapping from the quantum dot excited state can suppress radiative recombination of excitons. See, e.g., Chibli, H., et al., "Cytotoxicity of InP/ZnS quantum dots related to reactive oxygen species generation," *Nanoscale* 3:2552-2559 (2011); Blackburn, J. L., et al., "Electron and Hole Transfer from Indium Phosphide Quantum Dots," *J. Phys. Chem. B* 109:2625-2631 (2005); and Selmarten, D., et al., "Quenching of Semiconductor Quantum Dot Photoluminescence by a π-Conjugated Polymer," *J. Phys. Chem. B* 109:15927-15933 (2005).

Achieving high photoluminescence quantum yield (PLQY) in emissive quantum dots is critical to their performance in emissive display applications including quantum dot enhancement films, quantum dots on glass, and quantum dot photoresists. Existing approaches to increasing quantum yield rely on altering the quantum dot composition, either by changes to the core size or material, or to the shell layer compositions and thicknesses. These alterations directly impact other properties of the quantum dots including emission wavelength (PWL) and size.

A need exists to produce nanostructures that have high quantum yield, narrow emission peak width, tunable emission wavelength, and colloidal stability.

BRIEF SUMMARY OF THE INVENTION

The present invention describes a nanostructure composition comprising:
(a) at least one population of nanostructures, the nanostructures comprising a nanocrystal core and at least one shell;
(b) at least one metal halide bound to the surface of the nanostructures; and
(c) at least one metal carboxylate bound to the surface of the nanostructures.

In some embodiments, the nanocrystal core of the nanostructures is selected from the group consisting of Si, Ge, Sn, Se, Te, B, C, P, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $Al_2CO$, and combinations thereof.

In some embodiments, the nanocrystal core of the nanostructures comprises InP.

In some embodiments, the nanostructures in the nanostructure composition comprise at least two shells. In some embodiments, the nanostructures in the nanostructure composition comprise two shells.

In some embodiments, at least one shell of the nanostructures in the nanostructure composition is selected from the group consisting of CdS, CdSe, CdO, CdTe, ZnS, ZnO, ZnSe, ZnTe, MgTe, GaAs, GaSb, GaN, HgO, HgS, HgSe, HgTe, InAs, InSb, InN, AlAs, AlN, AlSb, AlS, PbS, PbO, PbSe, PbTe, MgO, MgS, MgSe, MgTe, CuCl, Ge, Si, and alloys thereof.

In some embodiments, at least one shell of the nanostructures in the nanostructure composition comprises ZnSe.

In some embodiments, at least one shell of the nanostructures in the nanostructure composition comprises ZnS.

In some embodiments, at least one shell comprises ZnSe and at least one shell comprises ZnS of the nanostructures in the nanostructure composition.

In some embodiments, the at least one metal halide bound to the nanostructures in the nanostructure composition is selected from the group consisting of LiF, NaF, KF, $BeF_2$, $MgF_2$, $CaF_2$, $SrF_2$, CuF, AgF, AuF, $ZnF_2$, $HgF_2$, $AlF_3$, $GaF_3$, $InF_3$, $SnF_2$, $PbF_2$, LiCl, NaCl, KCl, $BeCl_2$, $MgCl_2$, $CaCl_2$, $SrCl_2$, CuCl, AgCl, $ZnCl_2$, $HgCl_2$, $AlCl_3$, $GaCl_3$, $InCl_3$, $SnCl_2$, $PbCl_2$, LiBr, NaBr, KBr, $BeBr_2$, $MgBr_2$, $CaBr_2$, $SrBr_2$, CuBr, AgBr, AuBr, $ZnBr_2$, $HgBr_2$, $AlBr_3$, $GaBr_3$, $InBr_3$, $SnBr_2$, $PbBr_2$, LiI, NaI, KI, $BeI_2$, $MgI_2$, $CaI_2$, $SrI_2$, CuI, AgI, AuI, $ZnI_2$, $HgI_2$, $AlI_3$, $GaI_3$, $InI_3$, $SnI_2$, and $Pb_2$. In some embodiments, the at least one metal halide bound to the nanostructures in the nanostructure composition is selected from the group consisting of $ZnF_2$, $ZnCl_2$, $ZnBr_2$, and $ZnI_2$. In some embodiments, the at least one metal halide bound to the nanostructures in the nanostructure composition is $ZnCl_2$.

In some embodiments, the at least one metal carboxylate bound to the nanostructures in the nanostructure composition is selected from the group consisting of zinc oleate, zinc hexanoate, zinc laurate, zinc myristate, zinc palmitate, zinc stearate, and zinc PEG-carboxylate. In some embodiments, the at least one metal carboxylate bound to the nanostructures in the nanostructure composition is selected from the group consisting of zinc oleate, zinc laurate, and zinc PEG-carboxylate.

In some embodiments, the concentration of the at least one metal carboxylate is between about 0.01 mM and about 40 mM.

In some embodiments, the molar ratio of the at least one metal halide to the at least one metal carboxylate is between about 1:1 and about 1:8. In some embodiments, the molar ratio of the at least one metal halide to the at least one metal carboxylate in the nanostructure composition is between about 1:1 and about 1:3.

In some embodiments, the nanostructure composition further comprises a solvent. In some embodiments, the nanostructure composition further comprises a solvent selected from the group consisting of hexane, heptane, toluene, and chloroform.

In some embodiments, the nanostructure composition can be stably stored at a temperature between about 10° C. and about 90° C. between about 3 months and 3 years. In some embodiments, the nanostructure composition can be stably stored at a temperature between about 30° C. and about 90° C. between about 3 months and 3 years.

In some embodiments, the nanostructure composition exhibits a photoluminescence quantum yield of between about 80% and about 100%. In some embodiments, the nanostructure composition exhibits a photoluminescence quantum yield of between about 95% and about 100%.

In some embodiments, the nanostructure composition exhibits a full width at half maximum of between about 10 nm and about 60 nm. In some embodiments, the nanostructure composition exhibits a full width at half maximum of between about 30 nm and about 45 nm.

In some embodiments, the nanostructures of the nanostructure composition comprise a nanocrystal core comprising InP, at least one shell comprising ZnSe, at least one shell comprising ZnS, and at least one metal halide comprising $ZnCl_2$.

In some embodiments, the nanostructures of the nanostructure composition are quantum dots.

The present invention describes a method of preparing a nanostructure composition, the method comprising:
(a) providing at least one population of nanostructures, wherein the nanostructures comprise a nanocrystal core and at least one shell;
(b) admixing at least one metal carboxylate with the nanostructures of (a);
(c) admixing at least one metal halide with the nanostructures of (b); to produce a nanostructure composition.

In some embodiments, the nanocrystal core provided in the method of preparing a nanostructure composition is selected from the group consisting of Si, Ge, Sn, Se, Te, B, C, P, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $Al_2CO$, and combinations thereof. In some embodiments, the nanocrystal core provided in the method of preparing a nanostructure composition comprises InP.

In some embodiments, the nanostructures provided in the method of preparing a nanostructure composition comprise at least two shells.

In some embodiments, the nanostructures provided in the method of preparing a nanostructure composition comprise two shells.

In some embodiments, at least one shell of the nanostructures provided in the method of preparing a nanostructure composition is selected from the group consisting of CdS, CdSe, CdO, CdTe, ZnS, ZnO, ZnSe, ZnTe, MgTe, GaAs, GaSb, GaN, HgO, HgS, HgSe, HgTe, InAs, InSb, InN, AlAs, AlN, AlSb, AlS, PbS, PbO, PbSe, PbTe, MgO, MgS, MgSe, MgTe, CuCl, Ge, Si, and alloys thereof. In some embodiments, at least one shell provided in the method of preparing a nanostructure composition comprises ZnSe.

In some embodiments, at least one shell provided in the method of preparing a nanostructure composition comprises ZnS.

In some embodiments, at least one shell provided in the method of preparing a nanostructure composition comprises ZnSe and at least one shell comprises ZnS.

In some embodiments, at least one metal halide admixed in (c) in the method of preparing a nanostructure composition is selected from the group consisting of LiF, NaF, KF, $BeF_2$, $MgF_2$, $CaF_2$, $SrF_2$, CuF, AgF, AuF, $ZnF_2$, $HgF_2$, $AlF_3$, $GaF_3$, $InF_3$, $SnF_2$, $PbF_2$, LiCl, NaCl, KCl, $BeCl_2$, $MgCl_2$, $CaCl_2$, $SrCl_2$, CuCl, AgCl, $ZnCl_2$, $HgCl_2$, $AlCl_3$, $GaCl_3$, $InCl_3$, $SnCl_2$, $PBCl_2$, LiBr, NaBr, KBr, $BeBr_2$, $MgBr_2$, $CaBr_2$, $SrBr_2$, CuBr, AgBr, AuBr, $ZnBr_2$, $HgBr_2$, $AlBr_3$, $GaBr_3$, $InBr_3$, $SnBr_2$, $PbBr_2$, LiI, NaI, KI, $BeI_2$, $Mg_2$, $CaI_2$, $SrI_2$, CuI, AgI, AuI, $ZnI_2$, $HgI_2$, $AlI_3$, $GaI_3$, $InI_3$, $SnI_2$, and $PbI_2$. In some embodiments, at least one metal halide admixed in (c) in the method of preparing a nanostructure composition is selected from the group consisting of $ZnF_2$, $ZnCl_2$, $ZnBr_2$, and $ZnI_2$. In some embodiments at least one metal halide admixed in (c) in the method of preparing a nanostructure composition is $ZnCl_2$.

In some embodiments, at least one metal carboxylate admixed in (b) in the method of preparing a nanostructure composition is selected from the group consisting of zinc oleate, zinc hexanoate, zinc laurate, zinc myristate, zinc palmitate, zinc stearate, and zinc PEG-carboxylate. In some embodiments, at least one metal carboxylate admixed in (b) in the method of preparing a nanostructure composition is selected from the group consisting of zinc oleate, zinc laurate, and zinc PEG-carboxylate.

In some embodiments, between about 0.0001 mmol and about 1 mmol of at least one metal carboxylate per mL of a population of nanostructures with an $OD_{450}=1$ is admixed with the nanostructures of (a) in the method of preparing a nanostructure composition.

In some embodiments, between about 0.0001 mmol and about 1 mmol of at least one metal halide per mL of a population of nanostructures with an $OD_{450}=1$ is admixed with the nanostructures of (b) in the method of preparing a nanostructure composition.

In some embodiments, the molar ratio of the at least one metal halide to the at least one metal carboxylate is between about 1:1 and about 1:8 in the method of preparing a nanostructure composition. In some embodiments, the molar ratio of the at least one metal halide to the at least one metal carboxylate is between about 1:1 and about 1:3 provided in the method of preparing a nanostructure composition.

In some embodiments, the at least one population of nanostructures in (a) further comprises a solvent in the method of preparing a nanostructure composition. In some embodiments, the at least one population of nanostructures in (a) further comprises a solvent selected from the group consisting of hexane, heptane, toluene, and chloroform in the method of preparing a nanostructure composition.

In some embodiments, the admixing in (b) is at a temperature between about 10° C. and about 100° C. in the method of preparing a nanostructure composition.

In some embodiments, the admixing in (c) is at a temperature between about 10° C. and about 100° C. in the method of preparing a nanostructure composition.

In some embodiments, the nanostructure composition prepared by the method described herein exhibits a photoluminescence quantum yield of between about 0.1% and about 5.0% greater than the photoluminescence quantum yield exhibited by a nanostructure composition prepared without admixing at least one metal halide.

In some embodiments, the nanostructure composition prepared by the method described herein exhibits a full width at half maximum of between about 0.1 nm and about 2.0 nm lower than the full width at half maximum exhibited by a nanostructure composition prepared without admixing at least one metal halide.

The present invention describes a nanostructure film comprising at least one population of nanostructures, wherein the nanostructures comprise:

(a) a nanocrystal core and at least one shell;
(b) at least one metal halide bound to the surface of the nanostructures; and
(c) at least one metal carboxylate bound to the surface of the nanostructures.

In some embodiments, the nanostructure film further comprises an organic resin.

In some embodiments, the nanostructure film comprises between one and five populations of nanostructures. In some embodiments, the nanostructure film comprises one population of nanostructures.

In some embodiments, the at least one population of nanostructures in the nanostructure film comprises a core selected from the group consisting of Si, Ge, Sn, Se, Te, B, C, P, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $Al_2CO$, and combinations thereof. In some embodiments, the nanostructures in the nanostructure film comprise a nanocrystal core of InP.

In some embodiments, the nanostructures in the nanostructure film comprise at least two shells. In some embodiments, the nanostructures in the nanostructure film comprise two shells.

In some embodiments, at least one shell in the nanostructures of the nanostructure film is selected from the group consisting of CdS, CdSe, CdO, CdTe, ZnS, ZnO, ZnSe, ZnTe, MgTe, GaAs, GaSb, GaN, HgO, HgS, HgSe, HgTe, InAs, InSb, InN, AlAs, AlN, AlSb, AlS, PbS, PbO, PbSe, PbTe, MgO, MgS, MgSe, MgTe, CuCl, Ge, Si, and alloys thereof. In some embodiments, at least one shell in the nanostructures of the nanostructure film comprises ZnSe. In some embodiments, at least one shell in the nanostructures of the nanostructure film comprises ZnS.

In some embodiments, at least one shell comprises ZnSe and at least one shell comprises ZnS in the nanostructures of the nanostructure film.

In some embodiments, at least one metal halide bound to the nanostructures in the nanostructure film is selected from the group consisting of LiF, NaF, KF, $BeF_2$, $MgF_2$, $CaF_2$, $SrF_2$, CuF, AgF, AuF, $ZnF_2$, $HgF_2$, $AlF_3$, $GaF_3$, $InF_3$, $SnF_2$, $PbF_2$, LiCl, NaCl, KCl, $BeCl_2$, $MgCl_2$, $CaCl_2$, $SrCl_2$, CuCl, AgCl, $ZnCl_2$, $HgCl_2$, $AlCl_3$, $GaCl_3$, $InCl_3$, $SnCl_2$, $PBCl_2$, LiBr, NaBr, KBr, $BeBr_2$, $MgBr_2$, $CaBr_2$, $SrBr_2$, CuBr, AgBr, AuBr, $ZnBr_2$, $HgBr_2$, $AlBr_3$, $GaBr_3$, $InBr_3$, $SnBr_2$, $PbBr_2$, LiI, NaI, KI, $BeI_2$, $MgI_2$, $CaI_2$, $SrI_2$, CuI, AgI, AuI, $ZnI_2$, $HgI_2$, $AlI_3$, $GaI_3$, $InI_3$, $SnI_2$, and $PbI_2$. In some embodiments, at least one metal halide bound to the nanostructures in the nanostructure film is selected from the group consisting of $ZnF_2$, $ZnCl_2$, $ZnBr_2$, and $ZnI_2$. In some embodiments, at least one metal halide bound to the nanostructures in the nanostructure film is $ZnCl_2$.

In some embodiments, at least one metal carboxylate bound to the nanostructures in the nanostructure film is selected from the group consisting of zinc oleate, zinc hexanoate, zinc laurate, zinc myristate, zinc palmitate, zinc stearate, zinc dithiocarbamate, and zinc PEG-carboxylate. In some embodiments, at least one metal carboxylate bound to the nanostructures of the nanostructure film is selected from the group consisting of zinc oleate, zinc laurate, and zinc PEG-carboxylate.

In some embodiments, the concentration of the at least one metal carboxylate in the nanostructure film is between about 0.01 mM and about 40 mM.

In some embodiments, the molar ratio of the at least one metal halide to the at least one metal carboxylate in the nanostructure film is between about 1:1 and about 1:8. In some embodiments, the molar ratio of the at least one metal halide to the at least one metal carboxylate in the nanostructure film is between about 1:1 and about 1:3.

In some embodiments, the nanostructures in the nanostructure film are quantum dots.

In some embodiments, the nanostructure film comprises between one and five organic resins. In some embodiments, the nanostructure film comprises one organic resin.

In some embodiments, the nanostructure film comprises at least one organic resin, wherein the resin is a thermosetting resin or a UV curable resin.

In some embodiments, the nanostructure film comprises at least one organic resin, wherein the resin is a UV curable resin.

In some embodiments, a molded article comprises the nanostructure film described herein. In some embodiments, the molded article comprising the nanostructure film described herein is a light emitting diode or a liquid crystal display.

BRIEF DESCRIPTION OF THE DRAWINGS

FIG. 7 is a box plot of the PWL measurements for InP/ZnSe/ZnS quantum dot samples. The box on the left represents summarized data for purified quantum dot samples before the addition of $ZnCl_2$ and the box on the right represents summarized data after the addition of $ZnCl_2$.

DETAILED DESCRIPTION OF THE INVENTION

Definitions

Figure 1:
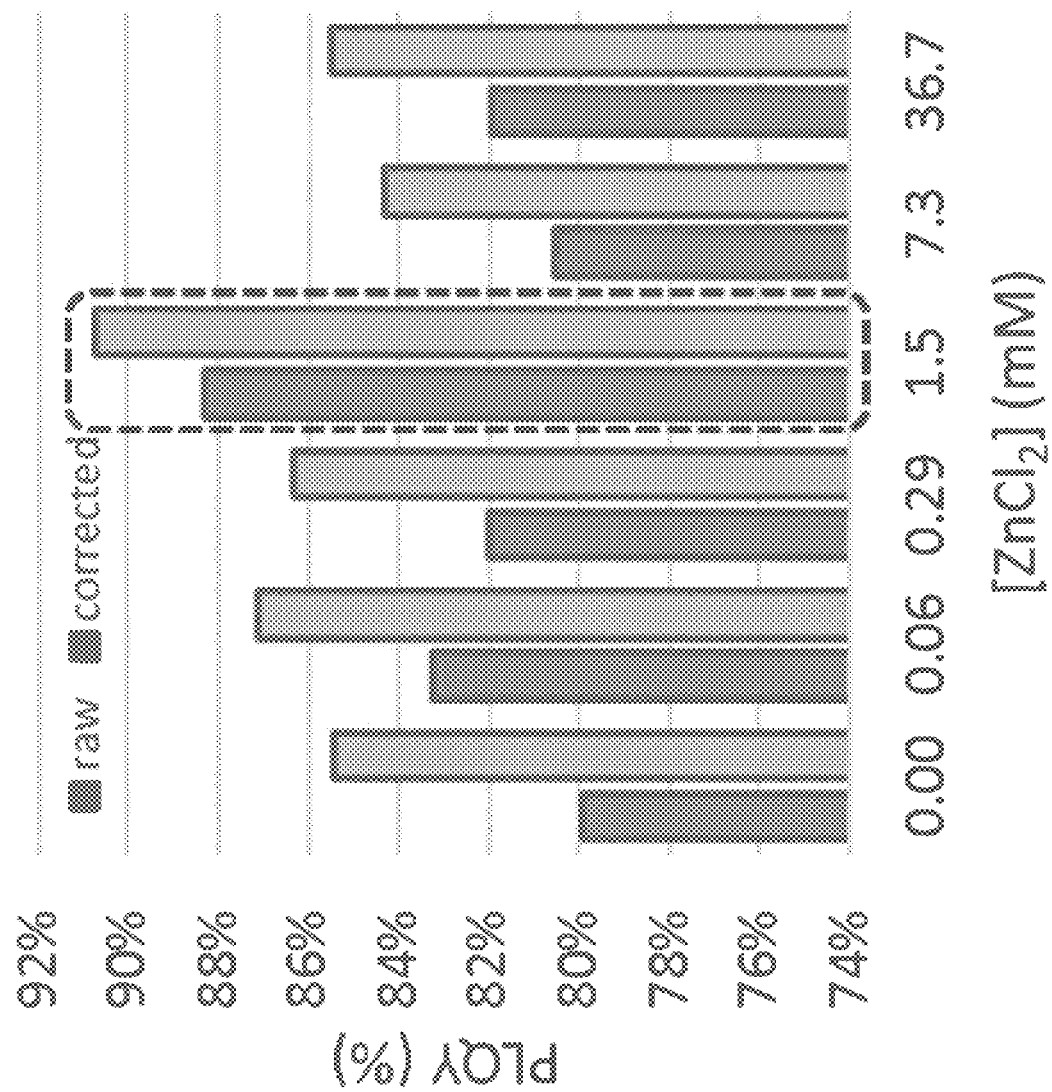
FIG. 1 is a bar graph of the photoluminescence quantum yield (PLQY) based on $ZnCl_2$ concentration added to InP/ZnSe/ZnS quantum dot samples. Measurements were performed on 100 µL quantum dot solutions at $OD_{450}$=1.5 on a commercial integrating sphere (Hamamatsu Quantaurus, Fukuoka, Japan). The concentration in the dashed box represents an optimal balance between quantum yield and colloidal stability.

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in the practice for testing of the present invention, the preferred materials and methods are described herein. Accordingly, the terminology used herein is for the purpose of describing particular embodiments only, and is not intended to be limiting.

As used in this specification and the appended claims, the singular forms "a," "an" and "the" include plural referents unless the context clearly dictates otherwise. Thus, for example, reference to "a nanostructure" includes a plurality of such nanostructures, and the like.

The term "about" as used herein indicates the value of a given quantity varies by ±10% of the value, or optionally ±5% of the value, or in some embodiments, by ±1% of the value so described. For example, "about 100 nm" encompasses a range of sizes from 90 nm to 110 nm, inclusive.

A "nanostructure" is a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, nanotripods, nanobipods, nanocrystals, nanodots, quantum dots, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can, but need not, completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell can contain non-crystalline regions and can even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

A "nanocrystal" is a nanostructure that is substantially monocrystalline. A nanocrystal thus has at least one region or characteristic dimension with a dimension of less than about 500 nm. In some embodiments, the nanocrystal has a dimension of less than about 200 nm, less than about 100 nm, less than about 50 nm, less than about 20 nm, or less than about 10 nm. The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. In some embodiments, each of the three dimensions of the nanocrystal has a dimension of less than about 500 nm, less than about 200 nm, less than about 100 nm, less than about 50 nm, less than about 20 nm, or less than about 10 nm.

The term "quantum dot" (or "dot") refers to a nanocrystal that exhibits quantum confinement or exciton confinement. Quantum dots can be substantially homogenous in material properties, or in certain embodiments, can be heterogeneous, e.g., including a core and at least one shell. The optical properties of quantum dots can be influenced by their particle size, chemical composition, and/or surface composition, and can be determined by suitable optical testing available in the art. The ability to tailor the nanocrystal size, e.g., in the range between about 1 nm and about 15 nm, enables photoemission coverage in the entire optical spectrum to offer great versatility in color rendering.

A "ligand" is a molecule capable of interacting (whether weakly or strongly) with one or more faces of a nanostructure, e.g., through covalent, ionic, van der Waals, or other molecular interactions with the surface of the nanostructure.

"Photoluminescence quantum yield" is the ratio of photons emitted to photons absorbed, e.g., by a nanostructure or population of nanostructures. As known in the art, quantum yield is typically determined by a comparative method using well-characterized standard samples with known quantum yield values.

As used herein, the term "monolayer" is a measurement unit of shell thickness derived from the bulk crystal structure of the shell material as the closest distance between relevant lattice planes. By way of example, for cubic lattice structures the thickness of one monolayer is determined as the distance between adjacent lattice planes in the [111] direction. By way of example, one monolayer of cubic ZnSe corresponds to 0.328 nm and one monolayer of cubic ZnS corresponds to 0.31 nm thickness. The thickness of a monolayer of alloyed materials can be determined from the alloy composition through Vegard's law.

As used herein, the term "shell" refers to material deposited onto the core or onto previously deposited shells of the same or different composition and that result from a single act of deposition of the shell material. The exact shell thickness depends on the material as well as the precursor input and conversion and can be reported in nanometers or monolayers. As used herein, "target shell thickness" refers to the intended shell thickness used for calculation of the required precursor amount. As used herein, "actual shell thickness" refers to the actually deposited amount of shell material after the synthesis and can be measured by methods known in the art. By way of example, actual shell thickness can be measured by comparing particle diameters determined from TEM images of nanocrystals before and after a shell synthesis.

As used herein, the term "full width at half-maximum" (FWHM) is a measure of the size distribution of quantum dots. The emission spectra of quantum dots generally have the shape of a Gaussian curve. The width of the Gaussian curve is defined as the FWHM and gives an idea of the size distribution of the particles. A smaller FWHM corresponds to a narrower quantum dot nanocrystal size distribution. FWHM is also dependent upon the emission wavelength maximum.

As used herein, the term "stable" refers to a mixture or composition that resists change or decomposition due to internal reaction or due to the action of air, heat, light, pressure, or other natural conditions. Nanostructures can be stored as a colloidal suspension in a solvent. Colloidal stability refers to the resistance to aggregation or sedimentation of the suspension.

"Peak emission wavelength" (PWL) is the wavelength where the radiometric emission spectrum of the light source reaches its maximum.

Unless clearly indicated otherwise, ranges listed herein are inclusive.

A variety of additional terms are defined or otherwise characterized herein.

Nanostructure Composition

In some embodiments, the present disclosure provides a nanostructure composition comprising:
- (a) at least one population of nanostructures, the nanostructures comprising a nanocrystal core and at least one shell;
- (b) at least one metal halide bound to the surface of the nanostructures; and
- (c) at least one metal carboxylate bound to the surface of the nanostructures.

In some embodiments, the nanostructure is a quantum dot.

Nanostructure Film

In some embodiments, the present disclosure provides a nanostructure film comprising:
- (a) at least one population of nanostructures, the nanostructures comprising a nanocrystal core and at least one shell;
- (b) at least one metal halide bound to the surface of the nanostructures; and
- (c) at least one metal carboxylate bound to the surface of the nanostructures.

In some embodiments, the nanostructure is a quantum dot.

In some embodiments, the present disclosure provides a nanostructure film comprising:
- (a) at least one population of nanostructures, the nanostructures comprising a nanocrystal core and at least one shell;
- (b) at least one metal halide bound to the surface of the nanostructures;

(c) at least one metal carboxylate bound to the surface of the nanostructures; and (d) at least one organic resin.

In some embodiments, the nanostructure is a quantum dot.

Nanostructure Molded Article

In some embodiments, the present disclosure provides a nanostructure molded article comprising:

(a) a first barrier layer;

(b) a second barrier layer; and (c) an emitting layer between the first barrier layer and the second barrier layer, wherein the emitting layer comprises a population of nanostructures comprising a nanocrystal core and at least one shell, at least one metal halide bound to the surface of the nanostructures, and at least one metal carboxylate bound to the surface of the nanostructures.

In some embodiments, the present disclosure provides a nanostructure molded article comprising:

(a) a first barrier layer;

(b) a second barrier layer; and (c) an emitting layer between the first barrier layer and the second barrier layer, wherein the emitting layer comprises a population of nanostructures comprising a nanocrystal core and at least one shell, at least one metal halide bound to the surface of the nanostructures, and at least one metal carboxylate bound to the surface of the nanostructures; and (d) at least one organic resin.

In some embodiments, the nanostructure is a quantum dot.

In some embodiments, the molded article is a film or substrate for a display. In some embodiments, the molded article is a liquid crystal display. In some embodiments, the molded article is a light emitting diode.

Nanocrystal Core

Methods for colloidal synthesis of a variety of nanostructures are known in the art. Such methods include techniques for controlling nanostructure growth, e.g., to control the size and/or shape distribution of the resulting nanostructures.

In a typical colloidal synthesis, semiconductor nanostructures are produced by rapidly injecting precursors that undergo pyrolysis into a hot solution (e.g., hot solvent and/or surfactant). The precursors can be injected simultaneously or sequentially. The precursors rapidly react to form nuclei. Nanostructure growth occurs through monomer addition to the nuclei, typically at a growth temperature that is lower than the injection/nucleation temperature.

Ligands interact with the surface of the nanostructure. At the growth temperature, the ligands rapidly adsorb and desorb from the nanostructure surface, permitting the addition and/or removal of atoms from the nanostructure while suppressing aggregation of the growing nanostructures. In general, a ligand that coordinates weakly to the nanostructure surface permits rapid growth of the nanostructure, while a ligand that binds more strongly to the nanostructure surface results in slower nanostructure growth. The ligand can also interact with one (or more) of the precursors to slow nanostructure growth.

Nanostructure growth in the presence of a single ligand typically results in spherical nanostructures. Using a mixture of two or more ligands, however, permits growth to be controlled such that non-spherical nanostructures can be produced, if, for example, the two (or more) ligands adsorb differently to different crystallographic faces of the growing nanostructure.

A number of parameters are thus known to affect nanostructure growth and can be manipulated, independently or in combination, to control the size and/or shape distribution of the resulting nanostructures. These include, e.g., temperature (nucleation and/or growth), precursor composition, time-dependent precursor concentration, ratio of the precursors to each other, surfactant composition, number of surfactants, and ratio of surfactant(s) to each other and/or to the precursors.

The synthesis of Group II-VI nanostructures has been described in U.S. Pat. Nos. 6,225,198, 6,322,901, 6,207,229, 6,607,829, 7,060,243, 7,374,824, 6,861,155, 7,125,605, 7,566,476, 8,158,193, and 8,101,234 and in U.S. Patent Appl. Publication Nos. 2011/0262752 and 2011/0263062. In some embodiments, the core is a Group II-VI nanocrystal selected from the group consisting of ZnO, ZnSe, ZnS, ZnTe, CdO, CdSe, CdS, CdTe, HgO, HgSe, HgS, and HgTe. In some embodiments, the core is a nanocrystal selected from the group consisting of ZnSe, ZnS, CdSe, and CdS.

Although Group II-VI nanostructures such as CdSe and CdS quantum dots can exhibit desirable luminescence behavior, issues such as the toxicity of cadmium limit the applications for which such nanostructures can be used. Less toxic alternatives with favorable luminescence properties are thus highly desirable. Group III-V nanostructures in general and InP-based nanostructures in particular, offer the best known substitute for cadmium-based materials due to their compatible emission range.

In some embodiments, the nanostructures are free from cadmium. As used herein, the term "free of cadmium" is intended that the nanostructures contain less than 100 ppm by weight of cadmium. The Restriction of Hazardous Substances (RoHS) compliance definition requires that there must be no more than 0.01% (100 ppm) by weight of cadmium in the raw homogeneous precursor materials. The cadmium level in the Cd-free nanostructures of the present invention is limited by the trace metal concentration in the precursor materials. The trace metal (including cadmium) concentration in the precursor materials for the Cd-free nanostructures, can be measured by inductively coupled plasma mass spectroscopy (ICP-MS) analysis, and are on the parts per billion (ppb) level. In some embodiments, nanostructures that are "free of cadmium" contain less than about 50 ppm, less than about 20 ppm, less than about 10 ppm, or less than about 1 ppm of cadmium.

In some embodiments, the core is a Group III-V nanostructure. In some embodiments, the core is a Group III-V nanocrystal selected from the group consisting of BN, BP, BAs, BSb, AlN, AlP, AlAs, AlSb, GaN, GaP, GaAs, GaSb, InN, InP, InAs, and InSb. In some embodiments, the core is an InP nanocrystal.

The synthesis of Group III-V nanostructures has been described in U.S. Pat. Nos. 5,505,928, 6,306,736, 6,576,291, 6,788,453, 6,821,337, 7,138,098, 7,557,028, 8,062,967, 7,645,397, and 8,282,412 and in U.S. Patent Appl. Publication No. 2015/236195. Synthesis of Group III-V nanostructures has also been described in Wells, R. L., et al., "The use of tris(trimethylsilyl)arsine to prepare gallium arsenide and indium arsenide," *Chem. Mater.* 1:4-6 (1989) and in Guzelian, A. A., et al., "Colloidal chemical synthesis and characterization of InAs nanocrystal quantum dots," *Appl. Phys. Lett.* 69: 1432-1434 (1996).

Synthesis of InP-based nanostructures has been described, e.g., in Xie, R., et al., "Colloidal InP nanocrystals as efficient emitters covering blue to near-infrared," *J. Am. Chem. Soc.* 129:15432-15433 (2007); Micic, O. I., et al., "Core-shell quantum dots of lattice-matched $ZnCdSe_2$ shells on InP cores: Experiment and theory," *J. Phys. Chem. B* 104:12149-12156 (2000); Liu, Z., et al., "Coreduction colloidal synthesis of III-V nanocrystals: The case of InP," *Angew. Chem.*

Int. Ed. Engl. 47:3540-3542 (2008); Li, L. et al., "Economic synthesis of high quality InP nanocrystals using calcium phosphide as the phosphorus precursor," Chem. Mater. 20:2621-2623 (2008); D. Battaglia and X. Peng, "Formation of high quality InP and InAs nanocrystals in a noncoordinating solvent," Nano Letters 2:1027-1030 (2002); Kim, S., et al., "Highly luminescent InP/GaP/ZnS nanocrystals and their application to white light-emitting diodes," J. Am. Chem. Soc. 134:3804-3809 (2012); Nann, T., et al., "Water splitting by visible light: A nanophotocathode for hydrogen production," Angew. Chem. Int. Ed. 49:1574-1577 (2010); Borchert, H., et al., "Investigation of ZnS passivated InP nanocrystals by XPS," Nano Letters 2:151-154 (2002); L. Li and P. Reiss, "One-pot synthesis of highly luminescent InP/ZnS nanocrystals without precursor injection," J. Am. Chem. Soc. 130:11588-11589 (2008); Hussain, S., et al. "One-pot fabrication of high-quality InP/ZnS (core/shell) quantum dots and their application to cellular imaging," Chemphyschem. 10:1466-1470 (2009); Xu, S., et al., "Rapid synthesis of high-quality InP nanocrystals," J. Am. Chem. Soc. 128:1054-1055 (2006); Micic, O. I., et al., "Size-dependent spectroscopy of InP quantum dots," J. Phys. Chem. B 101:4904-4912 (1997); Haubold, S., et al., "Strongly luminescent InP/ZnS core-shell nanoparticles," Chemphyschem. 5:331-334 (2001); CrosGagneux, A., et al., "Surface chemistry of InP quantum dots: A comprehensive study," J. Am. Chem. Soc. 132:18147-18157 (2010); Micic, O. I., et al., "Synthesis and characterization of InP, GaP, and GaInP$_2$ quantum dots," J. Phys. Chem. 99:7754-7759 (1995); Guzelian, A. A., et al., "Synthesis of size-selected, surface-passivated InP nanocrystals," J. Phys. Chem. 100: 7212-7219 (1996); Lucey, D. W., et al., "Monodispersed InP quantum dots prepared by colloidal chemistry in a non-coordinating solvent," Chem. Mater. 17:3754-3762 (2005); Lim, J., et al., "InP@ZnSeS, core@composition gradient shell quantum dots with enhanced stability," Chem. Mater. 23:4459-4463 (2011); and Zan, F., et al., "Experimental studies on blinking behavior of single InP/ZnS quantum dots: Effects of synthetic conditions and UV irradiation," J. Phys. Chem. C 116:394-3950 (2012). However, such efforts have had only limited success in producing InP nanostructures with high quantum yields.

In some embodiments, the core is doped. In some embodiments, the dopant of the nanocrystal core comprises a metal, including one or more transition metals. In some embodiments, the dopant is a transition metal selected from the group consisting of Ti, Zr, Hf, V, Nb, Ta, Cr, Mo, W, Mn, Tc, Re, Fe, Ru, Os, Co, Rh, Ir, Ni, Pd, Pt, Cu, Ag, Au, and combinations thereof. In some embodiments, the dopant comprises a non-metal. In some embodiments, the dopant is ZnS, ZnSe, ZnTe, CdSe, CdS, CdTe, HgS, HgSe, HgTe, CuInS$_2$, CuInSe$_2$, AlN, AlP, AlAs, GaN, GaP, or GaAs.

In some embodiments, the core is purified before deposition of a shell. In some embodiments, the core is filtered to remove precipitate from the core solution.

In some embodiments, the core is subjected to an acid etching step before deposition of a shell.

In some embodiments, the diameter of the core is determined by measuring the lowest-energy electronic transition using absorbance spectroscopy and modeling the corresponding quantum dot size based on the principles of quantum confinement. Quantum confinement in zero-dimensional nanocrystallites, such as quantum dots, arises from the spatial confinement of electrons within the crystallite boundary. Quantum confinement can be observed once the diameter of the material is of the same magnitude as the de Broglie wavelength of the wave function. The electronic and optical properties of nanoparticles deviate substantially from those of bulk materials. A particle behaves as if it were free when the confining dimension is large compared to the wavelength of the particle. During this state, the band gap remains at its original energy due to a continuous energy state. However, as the confining dimension decreases and reaches a certain limit, typically in nanoscale, the energy spectrum becomes discrete. As a result, the band gap becomes size-dependent.

Shell Layers

In some embodiments, the nanostructures of the present disclosure include a core and at least one shell. In some embodiments, the nanostructures of the present invention include a core and at least two shells. The shell can, e.g., increase the quantum yield and/or stability of the nanostructures. In some embodiments, the core and the shell comprise different materials. In some embodiments, the nanostructure comprises shells of different shell material.

In some embodiments, a shell that comprises a mixture of Group II and VI elements is deposited onto a core or a core/shell(s) structure. In some embodiments, the shell is deposited by a mixture of at least two of a zinc source, a selenium source, a sulfur source, a tellurium source, and a cadmium source. In some embodiments, the shell is deposited by a mixture of two of a zinc source, a selenium source, a sulfur source, a tellurium source, and a cadmium source. In some embodiments, the shell is deposited by a mixture of three of a zinc source, a selenium source, a sulfur source, a tellurium source, and a cadmium source. In some embodiments, the shell is composed of zinc and sulfur; zinc and selenium; zinc, sulfur, and selenium; zinc and tellurium; zinc, tellurium, and sulfur; zinc, tellurium, and selenium; zinc, cadmium, and sulfur; zinc, cadmium, and selenium; cadmium and sulfur; cadmium and selenium; cadmium, selenium, and sulfur; cadmium, zinc, and sulfur; cadmium, zinc, and selenium; or cadmium, zinc, sulfur, and selenium.

In some embodiments, a shell comprises more than one monolayer of shell material. The number of monolayers is an average for all the nanostructures; therefore, the number of monolayers in a shell can be a fraction. In some embodiments, the number of monolayers in a shell is between 0.25 and 10, between 0.25 and 8, between 0.25 and 7, between 0.25 and 6, between 0.25 and 5, between 0.25 and 4, between 0.25 and 3, between 0.25 and 2, between 2 and 10, between 2 and 8, between 2 and 7, between 2 and 6, between 2 and 5, between 2 and 4, between 2 and 3, between 3 and 10, between 3 and 8, between 3 and 7, between 3 and 6, between 3 and 5, between 3 and 4, between 4 and 10, between 4 and 8, between 4 and 7, between 4 and 6, between 4 and 5, between 5 and 10, between 5 and 8, between 5 and 7, between 5 and 6, between 6 and 10, between 6 and 8, between 6 and 7, between 7 and 10, between 7 and 8, or between 8 and 10. In some embodiments, the shell comprises between 3 and 5 monolayers.

The thickness of the shell can be controlled by varying the amount of precursor provided. For a given shell thickness, at least one of the precursors is optionally provided in an amount whereby, when a growth reaction is substantially complete, a shell of a predetermined thickness is obtained. If more than one different precursor is provided, either the amount of each precursor can be limited or one of the precursors can be provided in a limiting amount while the others are provided in excess.

The thickness of each shell can be determined using techniques known to those of skill in the art. In some embodiments, the thickness of each shell is determined by comparing the average diameter of the nanostructure before and after the addition of each shell. In some embodiments, the average diameter of the nanostructure before and after the addition of each shell is determined by TEM. In some embodiments, each shell has a thickness of between 0.05 nm and 3.5 nm, between 0.05 nm and 2 nm, between 0.05 nm and 0.9 nm, between 0.05 nm and 0.7 nm, between 0.05 nm and 0.5 nm, between 0.05 nm and 0.3 nm, between 0.05 nm and 0.1 nm, between 0.1 nm and 3.5 nm, between 0.1 nm and 2 nm, between 0.1 nm and 0.9 nm, between 0.1 nm and 0.7 nm, between 0.1 nm and 0.5 nm, between 0.1 nm and 0.3 nm, between 0.3 nm and 3.5 nm, between 0.3 nm and 2 nm, between 0.3 nm and 0.9 nm, between 0.3 nm and 0.7 nm, between 0.3 nm and 0.5 nm, between 0.5 nm and 3.5 nm, between 0.5 nm and 2 nm, between 0.5 nm and 0.9 nm, between 0.5 nm and 0.7 nm, between 0.7 nm and 3.5 nm, between 0.7 nm and 2 nm, between 0.7 nm and 0.9 nm, between 0.9 nm and 3.5 nm, between 0.9 nm and 2 nm, or between 2 nm and 3.5 nm.

In some embodiments, each shell is synthesized in the presence of at least one ligand type. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). In some embodiments, the ligand(s) for the core synthesis and for the shell synthesis are the same. In some embodiments, the ligand(s) for the core synthesis and for the shell synthesis are different. Following synthesis, any ligand on the surface of the nanostructures can be exchanged for a different ligand with other desirable properties. Examples of ligands are disclosed in U.S. Pat. Nos. 7,572,395, 8,143,703, 8,425,803, 8,563,133, 8,916,064, 9,005,480, 9,139,770, and 9,169,435, and in U.S. Patent Application Publication No. 2008/0118755.

Ligands suitable for the synthesis of a shell are known by those of skill in the art. In some embodiments, the ligand is a fatty acid selected from the group consisting of lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from the group consisting of dodecylamine, oleylamine, hexadecylamine, dioctylamine, and octadecylamine. In some embodiments, the ligand is tributylphosphine, oleic acid, or zinc oleate.

In some embodiments, each shell is produced in the presence of a mixture of ligands. In some embodiments, each shell is produced in the presence of a mixture comprising 2, 3, 4, 5, or 6 different ligands. In some embodiments, each shell is produced in the presence of a mixture comprising 3 different ligands. In some embodiments, the mixture of ligands comprises tributylphosphine, oleic acid, and zinc oleate.

In some embodiments, each shell is produced in the presence of a solvent. In some embodiments, the solvent is selected from the group consisting of 1-octadecene, 1-hexadecene, 1-eicosene, eicosane, octadecane, hexadecane, tetradecane, squalene, squalane, trioctylphosphine oxide, and dioctyl ether. In some embodiments, the solvent is 1-octadecene.

In some embodiments, a core or a core/shell(s) and shell precursor are contacted at an addition temperature between 20° C. and 310° C., between 20° C. and 280° C., between 20° C. and 250° C., between 20° C. and 200° C., between 20° C. and 150° C., between 20° C. and 100° C., between 20° C. and 50° C., between 50° C. and 310° C., between 50° C. and 280° C., between 50° C. and 250° C., between 50° C. and 200° C., between 50° C. and 150° C., between 50° C. and 100° C., between 100° C. and 310° C., between 100° C. and 280° C., between 100° C. and 250° C., between 100° C. and 200° C., between 100° C. and 150° C., between 150° C. and 310° C., between 150° C. and 280° C., between 150° C. and 250° C., between 150° C. and 200° C., between 200° C. and 310° C., between 200° C. and 280° C., between 200° C. and 250° C., between 250° C. and 310° C., between 250° C. and 280° C., or between 280° C. and 310° C. In some embodiments, a core or a core/shell(s) and shell precursor are contacted at an addition temperature between 20° C. and 100° C.

In some embodiments, after contacting a core or core/shell(s) and shell precursor, the temperature of the reaction mixture is increased to an elevated temperature between 200° C. and 310° C., between 200° C. and 280° C., between 200° C. and 250° C., between 200° C. and 220° C., between 220° C. and 310° C., between 220° C. and 280° C., between 220° C. and 250° C., between 250° C. and 310° C., between 250° C. and 280° C., or between 280° C. and 310° C. In some embodiments, after contacting a core or core/shell(s) and shell precursor, the temperature of the reaction mixture is increased to between 250° C. and 310° C.

In some embodiments, after contacting a core or core/shell(s) and shell precursor, the time for the temperature to reach the elevated temperature is between 2 and 240 minutes, between 2 and 200 minutes, between 2 and 100 minutes, between 2 and 60 minutes, between 2 and 40 minutes, between 5 and 240 minutes, between 5 and 200 minutes, between 5 and 100 minutes, between 5 and 60 minutes, between 5 and 40 minutes, between 10 and 240 minutes, between 10 and 200 minutes, between 10 and 100 minutes, between 10 and 60 minutes, between 10 and 40 minutes, between 40 and 240 minutes, between 40 and 200 minutes, between 40 and 100 minutes, between 40 and 60 minutes, between 60 and 240 minutes, between 60 and 200 minutes, between 60 and 100 minutes, between 100 and 240 minutes, between 100 and 200 minutes, or between 200 and 240 minutes.

In some embodiments, after contacting a core or core/shell(s) and shell precursor, the temperature of the reaction mixture is maintained at an elevated temperature for between 2 and 240 minutes, between 2 and 200 minutes, between 2 and 100 minutes, between 2 and 60 minutes, between 2 and 40 minutes, between 5 and 240 minutes, between 5 and 200 minutes, between 5 and 100 minutes, between 5 and 60 minutes, between 5 and 40 minutes, between 10 and 240 minutes, between 10 and 200 minutes, between 10 and 100 minutes, between 10 and 60 minutes, between 10 and 40 minutes, between 40 and 240 minutes, between 40 and 200 minutes, between 40 and 100 minutes, between 40 and 60 minutes, between 60 and 240 minutes, between 60 and 200 minutes, between 60 and 100 minutes, between 100 and 240 minutes, between 100 and 200 minutes, or between 200 and 240 minutes. In some embodiments, after contacting a core or core/shell(s) and shell precursor, the temperature of the reaction mixture is maintained at an elevated temperature for between 30 and 120 minutes.

In some embodiments, additional shells are produced by further additions of shell material precursors that are added to the reaction mixture followed by maintaining at an elevated temperature. Typically, additional shell precursor is provided after reaction of the previous shell is substantially complete (e.g., when at least one of the previous precursors is depleted or removed from the reaction or when no additional growth is detectable). The further additions of precursor create additional shells.

In some embodiments, the nanostructure is cooled before the addition of additional shell material precursor to provide further shells. In some embodiments, the nanostructure is maintained at an elevated temperature before the addition of shell material precursor to provide further shells.

After sufficient layers of shell have been added for the nanostructure to reach the desired thickness and diameter, the nanostructure can be cooled. In some embodiments, the core/shell(s) nanostructures are cooled to room temperature. In some embodiments, an organic solvent is added to dilute the reaction mixture comprising the core/shell(s) nanostructures.

In some embodiments, the organic solvent used to dilute the reaction mixture is ethanol, hexane, pentane, toluene, benzene, diethylether, acetone, ethyl acetate, dichloromethane (methylene chloride), chloroform, dimethylformamide, or N-methylpyrrolidinone. In some embodiments, the organic solvent is toluene.

In some embodiments, core/shell(s) nanostructures are isolated. In some embodiments, the core/shell(s) nanostructures are isolated by precipitation using an organic solvent. In some embodiments, the core/shell(s) nanostructures are isolated by flocculation with ethanol.

The number of monolayers will determine the size of the core/shell(s) nanostructures. The size of the core/shell(s) nanostructures can be determined using techniques known to those of skill in the art. In some embodiments, the size of the core/shell(s) nanostructures is determined using TEM. In some embodiments, the core/shell(s) nanostructures have an average diameter of between 1 nm and 15 nm, between 1 nm and 10 nm, between 1 nm and 9 nm, between 1 nm and 8 nm, between 1 nm and 7 nm, between 1 nm and 6 nm, between 1 nm and 5 nm, between 5 nm and 15 nm, between 5 nm and 10 nm, between 5 nm and 9 nm, between 5 nm and 8 nm, between 5 nm and 7 nm, between 5 nm and 6 nm, between 6 nm and 15 nm, between 6 nm and 10 nm, between 6 nm and 9 nm, between 6 nm and 8 nm, between 6 nm and 7 nm, between 7 nm and 15 nm, between 7 nm and 10 nm, between 7 nm and 9 nm, between 7 nm and 8 nm, between 8 nm and 15 nm, between 8 nm and 10 nm, between 8 nm and 9 nm, between 9 nm and 15 nm, between 9 nm and 10 nm, or between 10 nm and 15 nm. In some embodiments, the core/shell(s) nanostructures have an average diameter of between 6 nm and 7 nm.

Core/Shell(s) Nanostructures

In some embodiments, the core/shell(s) nanostructure is prepared using the method of U.S. Application Publication No. 2017/0306227, which is incorporated by reference in its entirety.

In some embodiments, the core/shell(s) nanostructure is a core/ZnSe/ZnS nanostructure. In some embodiments, the core/shell(s) nanostructure is an InP/ZnSe/ZnS nanostructure.

Nanostructure Composition

In some embodiments, the present disclosure provides a nanostructure composition comprising:
(a) at least one population of nanostructures, the nanostructures comprising a nanocrystal core and at least one shell;
(b) at least one metal halide bound to the surface of the nanostructures; and
(c) at least one metal carboxylate bound to the surface of the nanostructures.

In some embodiments, the nanostructure composition comprises 1, 2, 3, 4, 5, or 6 populations of nanostructures. In some embodiments, the nanostructure composition comprises 1 population of nanostructures. In some embodiments, the nanostructure composition comprises 2 populations of nanostructures. In some embodiments, the nanostructure composition comprises 3 populations of nanostructures.

Metal Halide

In some embodiments, the nanostructure composition comprises 1, 2, or 3 metal halides. In some embodiments, the nanostructure composition comprises 1 metal halide.

In some embodiments, the metal halide is selected from the group consisting of LiF, NaF, KF, $BeF_2$, $MgF_2$, $CaF_2$, $SrF_2$, CuF, AgF, AuF, $ZnF_2$, $HgF_2$, $AlF_3$, $GaF_3$, $InF_3$, $SnF_2$, $PbF_2$, LiCl, NaCl, KCl, $BeCl_2$, $MgCl_2$, $CaCl_2$, $SrCl_2$, CuCl, AgCl, $ZnCl_2$, $HgCl_2$, $AlCl_3$, $GaCl_3$, $InCl_3$, $SnCl_2$, $PbCl_2$, LiBr, NaBr, KBr, $BeBr_2$, $MgBr_2$, $CaBr_2$, $SrBr_2$, CuBr, AgBr, AuBr, $ZnBr_2$, $HgBr_2$, $AlBr_3$, $GaBr_3$, $InBr_3$, $SnBr_2$, $PbBr_2$, LiI, NaI, KI, $BeI_2$, $MgI_2$, $CaI_2$, $SrI_2$, CuI, AgI, AuI, $ZnI_2$, $HgI_2$, $AlI_3$, $GaI_3$, $InI_3$, $SnI_2$, and $PbI_2$.

In some embodiments, the metal halide is selected from the group consisting of $ZnF_2$, $ZnI_2$, $ZnBr_2$, and $ZnCl_2$.

In some embodiments, the metal halide is $ZnCl_2$.

Metal Carboxylate

1 In some embodiments, the nanostructure composition comprises 1, 2, or 3 metal carboxylates. In some embodiments, the nanostructure composition comprises 1 metal carboxylate.

In some embodiments, the metal carboxylate is a commercially available metal carboxylate.

In some embodiments, the metal carboxylate is produced by reacting a metal salt and a carboxylic acid.

In some embodiments, the metal salt is a zinc salt, a magnesium salt, a zirconium salt, a hafnium salt, a cesium salt, an indium salt, an aluminum salt, a calcium salt, a gallium salt, a strontium salt, a titanium salt, or a yttrium salt. In some embodiments, the metal salt is a zinc salt.

In some embodiments, the carboxylic acid is a $C_2$-$C_{24}$ carboxylic acid, wherein optionally one or more heteroatoms such as O, N, or S are substituted for one or more carbon atoms. In one embodiment, the carboxylic acid is selected from acetic acid, propionic acid, butyric acid, valeric acid, caproic acid, heptanoic acid, caprylic acid, capric acid, undecanoic acid, lauric acid, myristic acid, palmitic acid, stearic acid, behenic acid, acrylic acid, methacrylic acid, but-2-enoic acid, but-3-enoic acid, pent-2-enoic acid, pent-4-enoic acid, hex-2-enoic acid, hex-3-enoic acid, hex-4-enoic acid, hex-5-enoic acid, hept-6-enoic acid, oct-2-enoic acid, dec-2-enoic acid, undec-10-enoic acid, dodec-5-enoic acid, oleic acid, gadoleic acid, erucic acid, linoleic acid, α-linolenic acid, calendic acid, eicosadienoic acid, eicosatrienoic acid, arachidonic acid, stearidonic acid, benzoic acid, para-toluic acid, ortho-toluic acid, meta-toluic acid, hydrocinnamic acid, naphthenic acid, cinnamic acid, and para-toluenesulfonic acid. In another embodiment, the carboxylic acid is contains a heteroatom and is 2-[2-(2-methoxyethoxy)ethoxy]acetic acid, 2-(2-methoxyethoxy) acetic acid, (2-butoxyethoxy)acetic acid, 2-isobutoxyacetic acid, 3-methoxypropionic acid, methoxyacetic acid, or n-butoxyacetic acid.

In some embodiments, the carboxylic acid is a carboxylic acid polyethylene glycol (carboxylic acid PEG). In some embodiments, the carboxylic acid PEG is selected from PEG carboxyl methyl acid, PEG glutaric acid, PEG succinic acid, PEG glutaramide acid, and PEG succinamide acid.

In some embodiments, the metal carboxylate is a zinc carboxylate. In some embodiments, the zinc carboxylate is produced by reacting a zinc salt and a carboxylic acid.

In some embodiments, the metal salt is a zinc salt. In some embodiments, the zinc salt is selected from the group consisting of zinc acetate, zinc chloride, zinc sulfate, zinc bromide, zinc carbonate, zinc iodide, zinc nitrate, zinc citrate, zinc cyanide, zinc fluoride, zinc hexafluorosilicate, zinc methacrylate, zinc molybdate, zinc oxalate, zinc p-toluenesulfonate, zinc perchlorate, zinc phosphate, zinc sulfate, and zinc tetrafluoroborate.

In some embodiments, the zinc carboxylate is selected from the group consisting of zinc oleate, zinc hexanoate, zinc octanoate, zinc laurate, zinc myristate, zinc palmitate, zinc stearate, zinc dithiocarbamate, and zinc PEG-carboxylate. In some embodiments, the zinc carboxylate is zinc oleate, zinc laurate, or zinc PEG-carboxlyate.

Concentration of Metal Halide

The concentration of metal halide in the nanostructure composition is controlled by the volumetric addition of a stock solution of known concentration. The concentration of metal halide in the nanostructure composition can be measured using an analytical chemical technique such as X-ray photoelectron spectroscopy (XPS). For a 100 µL nanostructure composition with an $OD_{450}$=1.5, the concentration of the metal halide is between about 0.01 mM and about 40 mM, about 0.01 mM and about 20 mM, about 0.01 mM and about 10 mM, about 0.01 mM and about 5 mM, about 0.01 mM and about 2.5 mM, about 0.01 mM and about 1.5 mM, about 0.01 mM and about 1 mM, about 0.01 mM and about 0.5 mM, about 0.01 mM and about 0.25 mM, about 0.25 mM and about 40 mM, about 0.25 mM and about 20 mM, about 0.25 mM and about 10 mM, about 0.25 mM and about 5 mM, about 0.25 mM and about 2.5 mM, about 0.25 mM and about 1.5 mM, about 0.25 mM and about 1.5 mM, about 0.25 mM and about 1 mM, about 0.25 mM and about 0.5 mM, about 0.25 mM and about 0.25 mM, about 0.5 mM and about 40 mM, about 0.5 mM and about 20 mM, about 0.5 mM and about 10 mM, about 0.5 mM and about 5 mM, about 0.5 mM and about 2.5 mM, about 0.5 mM and about 1.5 mM, about 0.5 mM and about 1 mM, about mM and about 40 mM, about 1 mM and about 20 mM, about 1 mM and about 10 mM, about 1 mM and about 5 mM, about 1 mM and about 2.5 mM, about 1 mM and about 1.5 mM, about 1.5 mM and about 40 mM, about 1.5 mM and about 20 mM, about 1.5 mM and about 10 mM, about 1.5 mM and about 5 mM, about 1.5 mM and about 2.5 mM, about 2.5 mM and about 40 mM, about 2.5 mM and about 20 mM, about 2.5 mM and about 10 mM, about 2.5 mM and about 5 mM, about 5 mM and about 40 mM, about 5 mM and about 20 mM, about 5 mM and about 10 mM, about 10 mM and about 40 mM, about 10 mM and about 20 mM, or about 20 mM and about 40 mM. For a 100 µL nanostructure composition with an $OD_{450}$=1.5, the concentration of the metal halide is between about 1 mM and about 2.5 mM.

In some embodiments, for a volume of 1 mL of a population of nanostructures with an $OD_{450}$=1, the amount of metal halide added is between about 0.0001 mmol and about 1 mmol, about 0.0001 mmol and about 0.5 mmol, about 0.0001 mmol and about 0.1 mmol, about 0.0001 mmol and about 0.05 mmol, about 0.0001 mmol and about 0.01 mmol, about 0.0001 mmol and about 0.005 mmol, about 0.0001 mmol and about 0.001 mmol, about 0.001 mmol and about 1 mmol, about 0.001 mmol and about 0.5 mmol, about 0.001 mmol and about 0.1 mmol, about 0.001 mmol and about 0.05 mmol, about 0.001 mmol and about 0.01 mmol, about 0.001 mmol and about 0.005 mmol, about 0.005 mmol and about 1 mmol, about 0.005 mmol and about 0.5 mmol, about 0.005 mmol and about 0.1 mmol, about 0.005 mmol and about 0.05 mmol, about 0.005 mmol and about 0.01 mmol, about 0.01 mmol and about 1 mmol, about 0.01 mmol and about 0.5 mmol, about 0.01 mmol and about 1 mmol, about 0.01 mmol and about 0.05 mmol, about 0.05 mmol and about 1 mmol, about 0.05 mmol and about 0.5 mmol, about 0.05 mmol and about 0.1 mmol, about 0.1 mmol and about 1 mmol, about 0.1 mmol and about 0.5 mmol, or about 0.5 mmol and about 1 mmol.

Concentration of Metal Carboxylate

The concentration of metal carboxylate in the nanostructure composition can be measured relative to the quantum dot concentration by quantitative nuclear magnetic resonance (NMR) spectroscopy. The quantum dot concentration can be determined by optical density (OD) measurement. OD can be measured at 450 nm using a 1 cm path length cuvette. For a 100 µL nanostructure composition with an $OD_{450}$=1.5, the concentration of the metal carboxylate is between about 0.01 mM and about 40 mM, about 0.01 mM and about 20 mM, about 0.01 mM and about 10 mM, about 0.01 mM and about 5 mM, about 0.01 mM and about 2.5 mM, about 0.01 mM and about 1.5 mM, about 0.01 mM and about 1 mM, about 0.01 mM and about 0.5 mM, about 0.01 mM and about 0.25 mM, about 0.25 mM and about 40 mM, about 0.25 mM and about 20 mM, about 0.25 mM and about 10 mM, about 0.25 mM and about 5 mM, about 0.25 mM and about 2.5 mM, about 0.25 mM and about 1.5 mM, about 0.25 mM and about 1.5 mM, about 0.25 mM and about 1 mM, about 0.25 mM and about 0.5 mM, about 0.25 mM and about 0.25 mM, about 0.5 mM and about 40 mM, about 0.5 mM and about 20 mM, about 0.5 mM and about 10 mM, about 0.5 mM and about 5 mM, about 0.5 mM and about 2.5 mM, about 0.5 mM and about 1.5 mM, about 0.5 mM and about 1 mM, about mM and about 40 mM, about 1 mM and about 20 mM, about 1 mM and about 10 mM, about 1 mM and about 5 mM, about 1 mM and about 2.5 mM, about 1 mM and about 1.5 mM, about 1.5 mM and about 40 mM, about 1.5 mM and about 20 mM, about 1.5 mM and about 10 mM, about 1.5 mM and about 5 mM, about 1.5 mM and about 2.5 mM, about 2.5 mM and about 40 mM, about 2.5 mM and about 20 mM, about 2.5 mM and about 10 mM, about 2.5 mM and about 5 mM, about 5 mM and about 40 mM, about 5 mM and about 20 mM, about 5 mM and about 10 mM, about 10 mM and about 40 mM, about 10 mM and about 20 mM, or about 20 mM and about 40 mM. For a 100 µL nanostructure composition with an $OD_{450}$=1.5, the concentration of the metal carboxylate is between about 1 mM and about 2.5 mM.

In some embodiments, for a volume of 1 mL of a population of nanostructures with an $OD_{450}$=1, the amount of metal carboxylate added is between about 0.0001 mmol and about 1 mmol, about 0.0001 mmol and about 0.5 mmol, about 0.0001 mmol and about 0.1 mmol, about 0.0001 mmol and about 0.05 mmol, about 0.0001 mmol and about 0.01 mmol, about 0.0001 mmol and about 0.005 mmol, about 0.0001 mmol and about 0.001 mmol, about 0.001 mmol and about 1 mmol, about 0.001 mmol and about 0.5 mmol, about 0.001 mmol and about 0.1 mmol, about 0.001 mmol and about 0.05 mmol, about 0.001 mmol and about 0.01 mmol, about 0.001 mmol and about 0.005 mmol, about 0.005 mmol and about 1 mmol, about 0.005 mmol and about 0.5 mmol, about 0.005 mmol and about 0.1 mmol, about 0.005 mmol and about 0.05 mmol, about 0.005 mmol and about 0.01 mmol, about 0.01 mmol and about 1 mmol, about 0.01 mmol and about 0.5 mmol, about 0.01 mmol and about 1 mmol, about 0.01 mmol and about 0.05 mmol, about 0.05 mmol and about 1 mmol, about 0.05 mmol and about 0.5 mmol, about 0.05 mmol and about 0.1 mmol, about 0.1 mmol and about 1 mmol, about 0.1 mmol and about 0.5 mmol, or about 0.5 mmol and about 1 mmol.

Ratio of Metal Halide to Metal Carboxylate

In some embodiments, the molar ratio of metal halide to metal carboxylate is between about 1:1 and about 1:8, about 1:1 and about 1:7, 1:1 and about 1:6, about 1:1 and about 1:5, about 1:1 and about 1:4, about 1:1 and about 1:3, about 1:1 and about 1:2, about 1:2 and about 1:8, about 1:2 and about 1:7, about 1:2 and about 1:6, about 1:2 and about 1:5, about 1:2 and about 1:4, about 1:2 and about 1:3, about 1:3 and about 1:8, about 1:3 and about 1:7, about 1:3 and about 1:6, about 1:3 and about 1:5, about 1:3 and about 1:4, about 1:4 and about 1:8, about 1:4 and about 1:7, about 1:4 and about 1:6, about 1:4 and about 1:5, about 1:5 and about 1:8, about 1:5 and about 1:7, about 1:5 and about 1:6, about 1:6 and about 1:8, about 1:6 and about 1:7, or about 1:7 and about 1:8. In some embodiments, the molar ratio of metal halide to metal carboxylate is between about 1:1 and about 1:3.

Solvents

In some embodiments, the nanostructure composition further comprises a solvent.

In some embodiments, the solvent is selected from the group consisting of chloroform, acetone, hexane, heptane, butanone, ethylene glycol monoethyl ether, ethylene glycol monopropyl ether, 1,4-butanediol diacetate, diethylene glycol monobutyl ether acetate, ethylene glycol monobutyl ether acetate, glyceryl triacetate, heptyl acetate, hexyl acetate, pentyl acetate, butyl acetate, ethyl acetate, diethylene glycol butyl methyl ether, diethylene glycol monobutyl ether, di(proyplene glyocl) dimethyl ether, diethylene glycol ethyl methyl ether, ethylene glycol monobutyl ether, diethylene glycol diethyl ether, methyl ethyl ketone, methyl isobutyl ketone, monomethyl ether glycol ester, gamma-butyrolactone, methylacetic-3-ethyl ether, butyl carbitol, butyl carbitol acetate, propanediol monomethyl ether, propanediol monomethyl ether acetate, cyclohexane, toluene, xylene, isopropyl alcohol, and combinations thereof. In some embodiments, the solvent is hexane, heptane, toluene, or chloroform.

Ligand Exchange

In some embodiments, the present disclosure is directed to a method of replacing a first ligand on a nanostructure with a second ligand. In some embodiments, the second ligand is a metal halide ligand. In some embodiments, the second ligand is a metal carboxylate ligand. In some embodiments, the second ligand is a combination of metal halide ligands and metal carboxylate ligands. In some embodiments, the nanostructure is a quantum dot.

The percentage of first ligands displaced by metal carboxylate ligands can be measured by $^1$H NMR. In some embodiments, the mole percentage of first ligands displaced by the metal carboxylate ligands is between about 20% and about 100%, about 20% and about 80%, about 20% and about 60%, about 20% and about 40%, about 25% and about 100%, about 25% and about 80%, about 25% and about 60%, about 25% and about 40%, about 30% and about 100%, about 30% and about 80%, about 30% and about 60%, about 30% and about 40%, about 40% and about 100%, about 40% and about 80%, about 40% and about 60%, about 600% and about 1000%, about 60% and about 80%, or about 80% and about 100%.

The percentage of metal carboxylate ligands that are bound to a nanostructure in a population of nanostructures can be measured by $^1$H NMR, wherein the percentage of bound ligands are calculated using: (bound metal carboxylate ligands)/(bound+free metal carboxylate ligands)×100%.

In some embodiments, the mole percentage of metal carboxylate ligands bound to a nanostructure is between about 20% and about 100% is between about 20% and about 100%, about 20% and about 80%, about 20% and about 60%, about 20% and about 40%, about 25% and about 1000%, about 25% and about 80%, about 25% and about 60%, about 25% and about 400%, about 300% and about 100%, about 30% and about 80%, about 30% and about 60%, about 30% and about 40%, about 40% and about 100%, about 40% and about 80%, about 400 and about 600, about 600 and about 100%, about 60% and about 80%, or about 80% and about 100%.

Colloidal Stability of Nanostructures Functionalized with a Metal Halide and/or Metal Carboxylate In some embodiments, the nanostructures are stored as a colloidal suspension in a solvent. A colloid is a mixture in which one substance of microscopically dispersed insoluble particles is suspended throughout another substance. Colloidal stability can be determined by measuring the number of insoluble particles remaining suspended at equilibrium. Colloidal stability can be hindered by aggregation or sedimentation of the insoluble particles.

Passivating the nanostructures with a metal halide and/or a metal carboxylate maintains the colloidal stability and allows for storage of the nanoparticles for extended periods of time. In some embodiments, the nanostructures functionalized with a metal halide and/or a metal carboxylate can be stored at a temperature between about 10° C. and about 90° C. for between about 1 minute and about 3 years, about 1 minute and about 12 months, about 1 minute and about 6 months, about 1 minute and about 3 months, about 1 minute and about 1 month, about 1 minute and about 15 days, about 1 minute and about 1 day, about 1 day and about 3 years, about 1 day and about 12 months, about 1 day and about 6 months, about 1 day and about 3 months, about 1 day and about 1 month, about 1 day and about 7 days, about 1 day and about 15 days, about 1 day and about 7 days, about 1 day and about 2 days, about 2 days and about 3 years, about 2 days and about 12 months, about 2 days and about 6 months, about 2 days and about 3 months, about 2 days and about 1 month, about 2 days and about 15 days, about 2 days and about 7 days, about 7 days and about 3 years, about 7 days and about 12 months, about 7 day and about 6 months, about 7 days and about 3 months, about 7 days and about 1 month, about 7 days and about 15 days, about 15 days and about 3 years, about 15 days and about 12 months, about 15 days and about 6 months, about 15 days and about 3 months, about 15 days and about 1 month, about 1 month and about 3 years, about 1 month and about 12 months, about 1 month and about 6 months, about 1 month and about 3 months, about 3 months and about 3 years, about 3 months and about 12 months, about 3 months and about 6 months, about 6 months and about 3 years, about 6 months and about 12 months, or about 12 months and about 3 years.

In some embodiments, nanostructures functionalized with a metal halide and/or a metal carboxylate can be stored at a temperature between about 30° C. and about 90° C. for between about 1 minute and about 3 years, about 1 minute and about 12 months, about 1 minute and about 6 months, about 1 minute and about 3 months, about 1 minute and about 1 month, about 1 minute and about 15 days, about 1 minute and about 1 day, about 1 day and about 3 years, about 1 day and about 12 months, about 1 day and about 6 months, about 1 day and about 3 months, about 1 day and about 1 month, about 1 day and about 7 days, about 1 day and about 15 days, about 1 day and about 7 days, about 1 day and about 2 days, about 2 days and about 3 years, about 2 days and about 12 months, about 2 days and about 6 months, about 2 days and about 3 months, about 2 days and about 1 month, about 2 days and about 15 days, about 2 days and about 7 days, about 7 days and about 3 years, about 7 days and about 12 months, about 7 day and about 6 months, about 7 days and about 3 months, about 7 days and about 1 month, about 7 days and about 15 days, about 15 days and about 3 years, about 15 days and about 12 months, about 15 days and about 6 months, about 15 days and about 3 months, about 15 days and about 1 month, about 1 month and about 3 years, about 1 month and about 12 months, about 1 month and about 6 months, about 1 month and about 3 months, about 3 months and about 3 years, about 3 months and about 12 months, about 3 months and about 6 months, about 6 months and about 3 years, about 6 months and about 12 months, or about 12 months and about 3 years.

Improved Properties of Nanostructures Functionalized with a Metal Halide and/or a Metal Carboxylate In some embodiments, the core/shell(s) nanostructures functionalized with a metal halide and/or a metal carboxylate display high photoluminescence quantum yield. In some embodiments, the core/shell(s) nanostructures can have a photoluminescence quantum yield of between 60% and 100%0%, between 60% and 95%, between 60%0 and 90%, between 60% and 85%, between 60% and 80%, between 60% and 70%, between 70% and 100%0%, between 70% and 95%, between 70% and 90%, between 70% and 85%, between 70% and 80%, between 80% and 100%0%, between 80% and 95%, between 80% to 90%, between 80% and 85%, between 85% and 100%0%, between 85% and 95%, between 80% and 85%, between 85% and 99%, between 85% and 90%, between 90% and 100%, between 90% and 95%, or between 95% and 100%. In some embodiments, the core/shell(s) nanostructures functionalized with a metal halide and/or a metal carboxylate can have a photoluminescence quantum yield of between 95% and 100%.

The photoluminescence spectrum of the core/shell(s) nanostructures functionalized with a metal halide and/or a metal carboxylate can cover essentially any desired portion of the spectrum. In some embodiments, the photoluminescence spectrum for the core/shell(s) nanostructures can have a emission maximum between 300 nm and 750 nm, between 300 nm and 650 nm, between 300 nm and 550 nm, between 300 nm and 450 nm, between 450 nm and 750 nm, between 450 nm and 650 nm, between 450 nm and 550 nm, between 450 nm and 750 nm, between 450 nm and 650 nm, between 450 nm and 550 nm, between 550 nm and 750 nm, between 550 nm and 650 nm, or between 650 nm and 750 nm. In some embodiments, the photoluminescence spectrum for the core/shell(s) nanostructures can have an emission maximum of between 500 nm and 550 nm. In some embodiments, the photoluminescence spectrum for the core/shell(s) nanostructures functionalized with a metal halide and/or a metal carboxylate can have an emission maximum of between 600 nm and 650 nm.

The size distribution of the core/shell(s) nanostructures functionalized with a metal halide and/or a metal carboxylate can be relatively narrow. In some embodiments, the photoluminescence spectrum of the population of core/shell(s) nanostructures functionalized with a metal halide and/or a metal carboxylate can have a full width at half maximum of between 10 nm and 60 nm, between 10 nm and 40 nm, between 10 nm and 30 nm, between 10 nm and 20 nm, between 20 nm and 60 nm, between 20 nm and 40 nm, between 20 nm and 30 nm, between 30 nm and 60 nm, between 30 nm and 40 nm, or between 40 nm and 60 nm. In some embodiments, the photoluminescence spectrum of the population or core/shell(s) nanostructures functionalized with a metal halide and/or a metal carboxylate can have a full width at half maximum of between 30 nm and 45 nm.

Nanostructure Film

In some embodiments, the core/shell(s) nanostructures functionalized with a metal halide and/or a metal carboxylate are incorporated into a nanostructure film. In some embodiments, the nanostructure film is incorporated into a quantum dot enhancement film (QDEF).

In some embodiments, the present disclosure provides a nanostructure film comprising:
  (a) at least one population of nanostructures, the nanostructures comprising a nanocrystal core and at least one shell;
  (b) at least one metal halide bound to the surface of the nanostructures; and
  (c) at least one metal carboxylate bound to the surface of the nanostructures.

In some embodiments, the nanostructure is a quantum dot.

In some embodiments, the present disclosure provides a nanostructure film comprising:
  (a) at least one population of nanostructures, the nanostructures comprising a nanocrystal core and at least one shell;
  (b) at least one metal halide bound to the surface of the nanostructures;
  (c) at least one metal carboxylate bound to the surface of the nanostructures; and
  (d) at least one organic resin.

In some embodiments, the nanostructure is a quantum dot.

In some embodiments, the core/shell(s) nanostructures functionalized with a metal halide and/or a metal carboxylate are embedded in a matrix. As used herein, the term "embedded" is used to indicate that the nanostructures are enclosed or encased within a matrix material that makes up the majority component of the matrix. In some embodiments, the nanostructures are uniformly distributed throughout the matrix material. In some embodiments, the nanostructures are distributed according to an application-specific uniformity distribution function.

In some embodiments, the nanostructures can include a homogenous population having sizes that emit in the blue visible wavelength spectrum, in the green visible wavelength spectrum, or in the red visible wavelength spectrum. In some embodiments, the nanostructures can include a first population of nanostructures having sizes that emit in the blue visible wavelength spectrum, a second population of nanostructures having sizes that emit in the green visible wavelength spectrum, and a third population of nanostructures having sizes that emit in the red visible wavelength spectrum.

The matrix material can be any suitable host matrix material capable of housing nanostructures. Suitable matrix materials can be chemically and optically compatible with nanostructures and any surrounding packaging materials or layers used in applying a nanostructure film to devices. Suitable matrix materials can include non-yellowing optical materials that are transparent to both the primary and secondary light, thereby allowing for both primary and secondary light to transmit through the matrix material. Matrix materials can include polymers and organic and inorganic oxides. Suitable polymers for use in the matrix material can be any polymer known to the ordinarily skilled artisan that can be used for such a purpose. The polymer can be substantially translucent or substantially transparent.

Matrix materials can include, but not limited to, epoxies, acrylates, norbornene, polyethylene, poly(vinyl butyral): poly(vinyl acetate), polyurea, polyurethanes; silicones and silicone derivatives including, but not limited to, amino silicone (AMS), polyphenylmethylsiloxane, polyphenylalkylsiloxane, polydiphenylsiloxane, polydialkylsiloxane, silsesquioxanes, fluorinated silicones, and vinyl and hydride substituted silicones; acrylic polymers and copolymers formed from monomers including, but not limited to, methylmethacrylate, butylmethacrylate, and laurylmethacrylate; styrene-based polymers such as polystyrene, amino polystyrene (APS), and poly(acrylonitrile ethylene styrene) (AES); polymers that are cross-linked with bifunctional monomers, such as divinylbenzene; cross-linkers suitable for cross-linking ligand materials, epoxides that combine with ligand amines (e.g., APS or polyethylene imine ligand amines) to form epoxy, and the like.

In some embodiments, the matrix material includes scattering microbeads such as $TiO_2$ microbeads, ZnS microbeads, or glass microbeads that can improve photo conversion efficiency of the nanostructure film. In some embodiments, the matrix material can include light blocking elements.

In some embodiments, the matrix material can have low oxygen and moisture permeability, exhibit high photo- and chemical-stability, exhibit favorable refractive indices, and adhere to outer surfaces of the nanostructures, thus providing an air-tight seal to protect the nanostructures. In another embodiment, the matrix material can be curable with UV or thermal curing methods to facilitate roll-to-roll processing.

In some embodiments, a nanostructure film can be formed by mixing nanostructures in a polymer (e.g., photoresist) and casting the nanostructure-polymer mixture on a substrate, mixing the nanostructures with monomers and polymerizing them together, mixing nanostructures in a sol-gel to form an oxide, or any other method known to those skilled in the art.

In some embodiments, the formation of a nanostructure film can include a film extrusion process. The film extrusion process can include forming a homogenous mixture of matrix material and barrier layer coated core-shell nanostructures such as nanostructures functionalized with a metal halide and/or a metal carboxylate, introducing the homogenous mixture into a top mounted hopper that feeds into an extruder. In some embodiments, the homogenous mixture can be in the form of pellets. The film extrusion process can further include extruding a nanostructure film from a slot die and passing an extruded nanostructure film through chill rolls. In some embodiments, the extruded nanostructure film can have a thickness less than about 75 µm, for example, in a range from about 70 µm to about 40 µm, about 65 µm to about 40 µm, about 60 µm to about 40 µm, or about 50 µm to about 40 µm. In some embodiments, the nanostructure film has a thickness less than about 10 µm. In some embodiments, the formation of the nanostructure film can optionally include a secondary process followed by the film extrusion process. The secondary process can include a process such as co-extrusion, thermoforming, vacuum forming, plasma treatment, molding, and/or embossing to provide a texture to a top surface of the nanostructure film layer. The textured top surface nanostructure film can help to improve, for example defined optical diffusion property and/or defined angular optical emission property of the nanostructure film.

Nanostructure Molded Article

In some embodiments, the nanostructure composition is used to form a nanostructure molded article. In some embodiments, the nanostructure molded article is a liquid crystal display (LCD) or a light emitting diode (LED). In some embodiments, the nanostructure composition is used to form the emitting layer of an illumination device. The illumination device can be used in a wide variety of applications, such as flexible electronics, touchscreens, monitors, televisions, cellphones, and any other high definition displays. In some embodiments, the illumination device is a light emitting diode or a liquid crystal display. In some embodiments, the illumination device is a quantum dot light emitting diode (QLED). An example of a QLED is disclosed in U.S. patent application Ser. No. 15/824,701, which is incorporated herein by reference in its entirety.

In some embodiments, the present disclosure provides a light emitting diode comprising:
 (a) a first conductive layer;
 (b) a second conductive layer; and
 (c) an emitting layer between the first conductive layer and the second conductive layer, wherein the emitting layer comprises (i) at least one population of nanostructures, the nanostructures comprising a nanocrystal core and at least one shell; (ii) at least one metal halide bound to the surface of the nanostructures; and (iii) at least one metal carboxylate bound to the surface of the nanostructures.

In some embodiments, the emitting layer is a nanostructure film.

In some embodiments, the light emitting diode comprises a first conductive layer, a second conductive layer, and an emitting layer, wherein the emitting layer is arranged between the first conductive layer and the second conductive layer. In some embodiments, the emitting layer is a thin film.

In some embodiments, the light emitting diode comprises additional layers between the first conductive layer and the second conductive layer such as a hole injection layer, a hole transport layer, and an electron transport layer. In some embodiments, the hole injection layer, the hole transport layer, and the electron transport layer are thin films. In some embodiments, the layers are stacked on a substrate.

When voltage is applied to the first conductive layer and the second conductive layer, holes injected at the first conductive layer move to the emitting layer via the hole injection layer and/or the hole transport layer, and electrons injected from the second conductive layer move to the emitting layer via the electron transport layer. The holes and electrons recombine in the emitting layer to generate excitons.

Quantum Dot on Glass LCD Display Device

In some embodiments, the nanostructure film is incorporated into a quantum dot on glass LCD display device. A LCD display device can include a nanostructure film formed directly on a light guide plate (LGP) without necessitating an intermediate substrate or barrier layer. In some embodiments, a nanostructure film can be a thin film. In some embodiments, a nanostructure film can have a thickness of 500 µm or less, 100 µm or less, or 50 µm or less. In some embodiments, a nanostructure film is a thin film having a thickness of about 15 µm or less.

A LGP can include an optical cavity having one or more sides, including at least a top side, comprising glass. Glass provides excellent resistance to impurities including moisture and air. Moreover, glass can be formed as a thin substrate while maintaining structural rigidity. Therefore, a LGP can be formed at least partially of a glass surface to provide a substrate having sufficient barrier and structural properties.

In some embodiments, a nanostructure film can be formed on a LGP. In some embodiments, the nanostructure film comprises a population of nanostructures embedded in a matrix material, such as a resin. A nanostructure film can be formed on a LGP by any method known in the art, such as wet coating, painting, spin coating, or screen printing. After deposition, a resin of a nanostructure film can be cured. In some embodiments a resin of one or more nanostructure films can be partially cured, further processed and then finally cured. The nanostructure films can be deposited as one layer or as separate layers, and the separate layers can comprise varying properties. The width and height of the nanostructure films can be any desired dimensions, depending on the size of the viewing panel of the display device. For example, the nanostructure films can have a relatively small surface area in small display device embodiments such as watches and phones, or the nanostructure films can have a large surface area for large display device embodiments such as TVs and computer monitors.

In some embodiments, an optically transparent substrate is formed on a nanostructure film by any method known in the art, such as vacuum deposition, vapor deposition, or the like. An optically transparent substrate can be configured to provide environmental sealing to the underlying layers and/or structures of the nanostructure film. In some embodiments, light blocking elements can be included in the optically transparent substrate. In some embodiments, light blocking elements can be included in a second polarizing filter, which can be positioned between the substrate and the nanostructure film. In some embodiments, light blocking elements can be dichroic filters that, for example, can reflect the primary light (e.g., blue light, UV light, or combination of UV light and blue light) while transmitting the secondary light. Light blocking elements can include specific UV light filtering components to remove any unconverted UV light from the red and green sub-pixels, and/or the UV light from the blue sub-pixels.

On-Chip and Near Chip Placement of Quantum Dots

In some embodiments, the nanostructures are incorporated into display devices by "on-chip" placements. As used herein, "on-chip" refers to placing nanostructures into an LED cup. In some embodiments, the nanostructures are dissolved in a resin or a fluid to fill the LED cup.

In some embodiments, the nanostructures are incorporated into display devices by "near-chip" placements. As used herein, "near-chip" refers to coating the top surface of the LED assembly with nanostructures such that the outgoing light passes through the nanostructure film.

Display Device with Nanostructure Color Conversion Layer

In some embodiments, the present invention provides a display device comprising:
  (a) a display panel to emit a first light;
  (b) a backlight unit configured to provide the first light to the display panel; and
  (c) a color filter comprising at least one pixel region comprising a color conversion layer.

In some embodiments, the color filter comprises at least 1, 2, 3, 4, 5, 6, 7, 8, 9, or 10 pixel regions. In some embodiments, when blue light is incident on the color filter, red light, white light, green light, and/or blue light may be respectively emitted through the pixel regions. In some embodiments, the color filter is described in U.S. Patent Appl. Publication No. 2017/153366, which is incorporated herein by reference in its entirety.

In some embodiments, each pixel region includes a color conversion layer. In some embodiments, a color conversion layer comprises nanostructures described herein configured to convert incident light into light of a first color. In some embodiments, the color conversion layer comprises nanostructures described herein configured to convert incident light into blue light.

In some embodiments, the display device comprises 1, 2, 3, 4, 5, 6, 7, 8, 9, or 10 color conversion layers. In some embodiments, the display device comprises 1 color conversion layer comprising the nanostructures described herein. In some embodiments, the display device comprises 2 color conversion layers comprising the nanostructures described herein. In some embodiments, the display device comprises 3 color conversion layers comprising the nanostructures described herein. In some embodiments, the display device comprises 4 color conversion layers comprising the nanostructures described herein. In some embodiments, the display device comprises at least one red color conversion layer, at least one green color conversion layer, and at least one blue color conversion layer.

In some embodiments, the color conversion layer has a thickness between about 3 μm and about 10 μm, about 3 μm and about 8 μm, about 3 μm and about 6 μm, about 6 μm and about 10 μm, about 6 μm and about 8 μm, or about 8 μm and about 10 μm. In some embodiments, the color conversion layer has a thickness between about 3 μm and about 10 μm.

The nanostructure color conversion layer can be deposited by any suitable method known in the art, including but not limited to painting, spray coating, solvent spraying, wet coating, adhesive coating, spin coating, tape-coating, roll coating, flow coating, inkjet printing, photoresist patterning, drop casting, blade coating, mist deposition, or a combination thereof. In some embodiments, the nanostructure color conversion layer is deposited by photoresist patterning. In some embodiments, nanostructure color conversion layer is deposited by inkjet printing.

Inkjet Printing

The formation of thin films using dispersions of nanostructures in organic solvents is often achieved by coating techniques such as spin coating. However, these coating techniques are generally not suitable for the formation of thin films over a large area and do not provide a means to pattern the deposited layer and thus, are of limited use. Inkjet printing allows for precisely patterned placement of thin films on a large scale at low cost. Inkjet printing also allows for precise patterning of nanostructure layers, allows printing pixels of a display, and eliminates photopatterning. Thus, inkjet printing is very attractive for industrial application—particularly in display applications.

Solvents commonly used for inkjet printing are dipropylene glycol monomethyl ether acetate (DPMA), polyglycidyl methacrylate (PGMA), diethylene glycol monoethyl ether acetate (EDGAC), and propylene glycol methyl ether acetate (PGMEA). Volatile solvents are also frequently used in inkjet printing because they allow rapid drying. Volatile solvents include ethanol, methanol, 1-propanol, 2-propanol, acetone, methyl ethyl ketone, methyl isobutyl ketone, ethyl acetate, and tetrahydrofuran. Conventional nanostructures generally cannot be dissolved in these solvents. However, the increased hydrophilicity of the nanostructures comprising poly(alkylene oxide) ligands allows for increased solubility in these solvents.

In some embodiments, the nanostructures described herein used for inkjet printing are dispersed in a solvent selected from DPMA, PGMA, EDGAC, PGMEA, ethanol, methanol, 1-propanol, 2-propanol, acetone, methyl ethyl ketone, methyl isobutyl ketone, ethyl acetate, tetrahydrofuran, chloroform, chlorobenzene, cyclohexane, hexane, heptane, octane, hexadecane, undecane, decane, dodecane, xylene, toluene, benzene, octadecane, tetradecane, butyl ether, or combinations thereof. In some embodiments, the nanostructures comprising a poly(alkylene oxide) ligands described herein used for inkjet printing are dispersed in a solvent selected from DPMA, PGMA, EDGAC, PGMEA, ethanol, methanol, 1-propanol, 2-propanol, acetone, methyl ethyl ketone, methyl isobutyl ketone, ethyl acetate, tetrahydrofuran, or combinations thereof.

In order to be applied by inkjet printing or microdispensing, the inkjet compositions comprising nanostructures should be dissolved in a suitable solvent. The solvent must be able to disperse the nanostructure composition and must not have any detrimental effect on the chosen print head.

In some embodiments, the inkjet composition further comprises one or more additional components such as surface-active compounds, lubricating agents, wetting agents, dispersing agents, hydrophobing agents, adhesive agents, flow improvers, defoaming agents, deaerators, diluents, auxiliaries, colorants, dyes, pigments, sensitizers, stabilizers, and inhibitors.

In some embodiments, the nanostructure compositions described herein comprise by weight of the inkjet composition between about 0.01% and about 20%. In some embodiments, the nanostructures comprising poly(alkylene oxide) ligands comprise by weight of the inkjet composition between about 0.01% and about 20%, about 0.01% and about 15%, about 0.01% and about 10%, about 0.01% and about 5%, about 0.01% and about 2%, about 0.01% and about 1%, about 0.01% and about 0.1%, about 0.01% and about 0.05%, about 0.05% and about 20%, about 0.05% and about 15%, about 0.05% and about 10%, about 0.05% and about 5%, about 0.05% and about 2%, about 0.05% and about 1%, about 0.05% and about 0.1%, about 0.1% and about 20%, about 0.1% and about 15%, about 0.1% and about 10%, about 0.1% and about 5%, about 0.1% and about 2%, about 0.1% and about 1%, about 0.5% and about 20%, about 0.5% and about 15%, about 0.5% and about 10%, about 0.5% and about 5%, about 0.5% and about 2%, about 0.5% and about 1%, about 1% and about 20%, about 1% and about 15%, about 1% and about 100%, about 1% and about 5%, about 1% and about 2%, about 2% and about 20%, about 2% and about 15%, about 2% and about 10, about 2% and about 5%, about 5% and about 20%, about 5% and about 15%, about 5° % and about 10%, about 100% and about 200%, about 100% and about 15%, or about 15% and 20%.

In some embodiments, the inkjet composition comprising a nanostructure or a nanostructure composition described herein is used in the formulation of an electronic device. In some embodiments, the inkjet composition comprising a nanostructure or a nanostructure composition described herein is used in the formulation of an electronic device selected from the group consisting of a nanostructure film, a display device, a lighting device, a backlight unit, a color filter, a surface light-emitting device, an electrode, a magnetic memory device, and a battery. In some embodiments, the inkjet composition comprising a nanostructure composition described herein is used in the formulation of a light-emitting device.

EXAMPLES

The following examples are illustrative and non-limiting, of the products and methods described herein. Suitable modifications and adaptations of the variety of conditions, formulations, and other parameters normally encountered in the field and which are obvious to those skilled in the art in view of this disclosure are within the spirit and scope of the invention.

Example 1

Procedure for Quantum Dot Transfer into PGMEA

To InP/ZnSe/ZnS quantum dots emitting in the range of 520-545 nm (prepared by the method described in U.S. Patent Appl. Publication No. 2017/306227) and dissolved in heptane was added an equal volume of propylene glycol monomethyl ether acetate (PGMEA). Then 2-[2-(2-methoxyethoxy)ethoxy]acetic acid was added to the solution. The mixture was stirred and heated at 30-100° C., then allowed to cool to room temperature. The quantum dots were precipitated with a non-polar anti-solvent and the mixture was centrifuged and the supernatant discarded. The quantum dots were then redissolved in PGMEA. The PGMEA solution was later concentrated by evaporation under dynamic vacuum or diluted by the addition of additional solvent to achieve a desired weight percentage of solids.

Example 2

Addition of $ZnCl_2$

Figure 2:
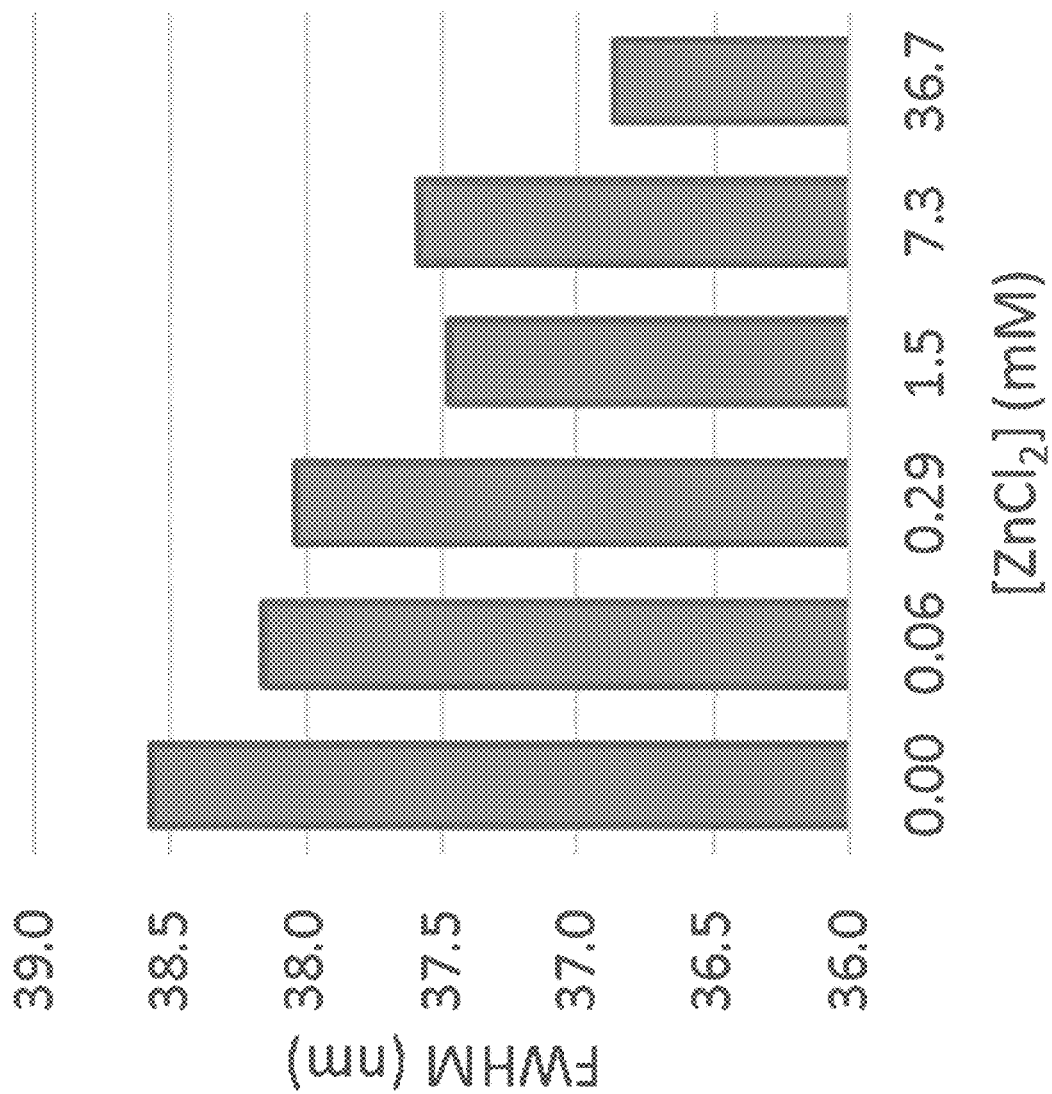
FIG. 2 is a bar graph of the full width at half maximum (FWHM) based on $ZnCl_2$ concentration added to InP/ZnSe/ZnS quantum dot samples. Measurements were performed on 100 µL quantum dot solutions at $OD_{450}$=1.5 on a commercial integrating sphere (Hamamatsu Quantaurus, Fukuoka, Japan).
Figure 3:
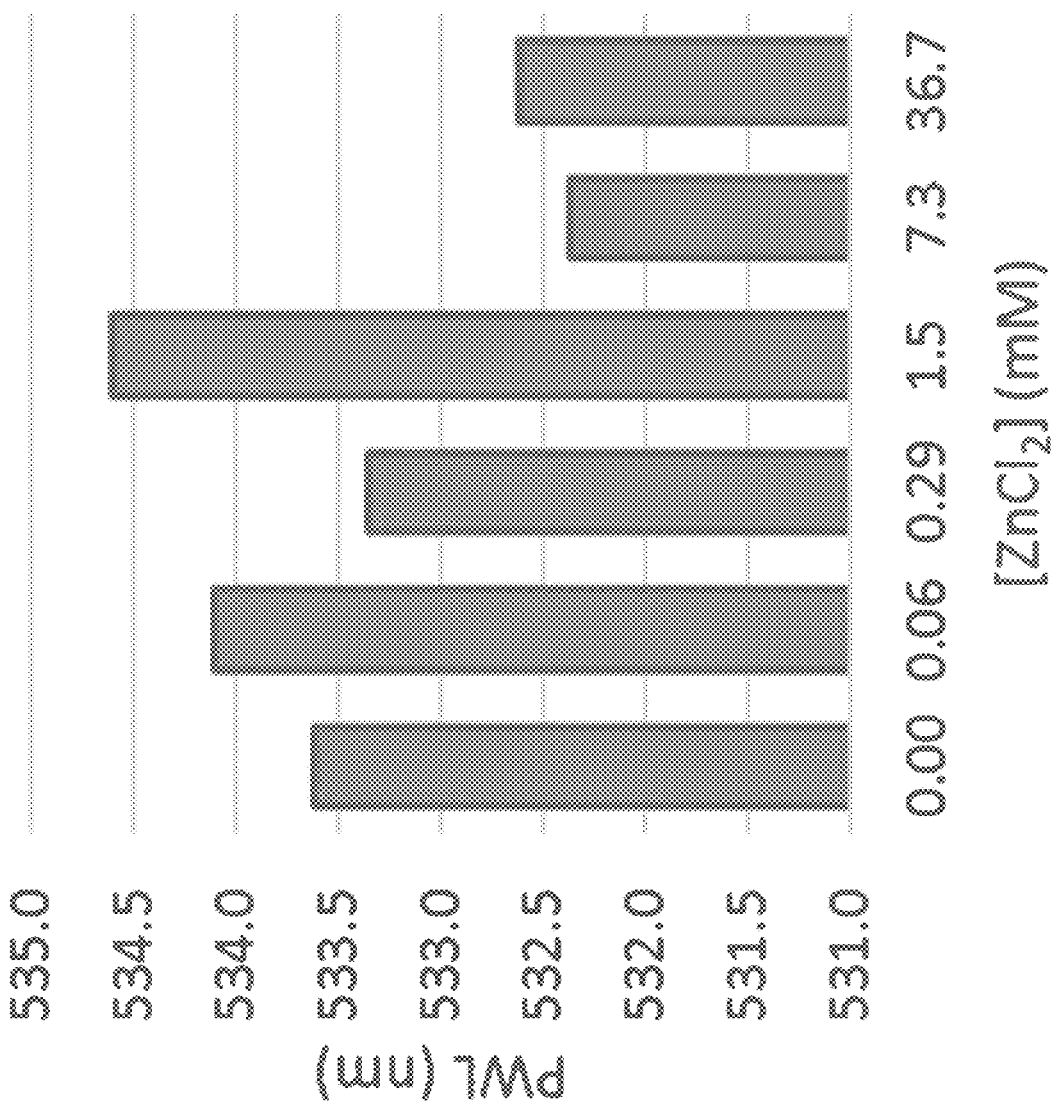
FIG. 3 is a bar graph of the peak wavelength (PWL) based on $ZnCl_2$ concentration added to InP/ZnSe/ZnS quantum dot samples. Measurements were performed on 100 µL quantum dot solutions at $OD_{450}=1.5$ on a commercial integrating sphere (Hamamatsu Quantaurus, Fukuoka, Japan).

Zinc chloride was added to purified InP/ZnSe/ZnS quantum dots (prepared by the method described in U.S. Patent Appl. Publication No. 2017/306227). The purified InP/ZnSe/ZnS quantum dots can be prepared in various solvents including heptane, hexane, toluene, and chloroform. Addition of the zinc chloride resulted in an increase of the measured quantum yield of the quantum dots. A range of $ZnCl_2$ concentrations were tested (0-25 mM per optical density (OD) unit at 450 nm) as shown in FIGS. 1-3. In some cases, quantum yield values after $ZnCl_2$ addition increased by 0.1-5.0% points and were between 95% and 98%.

Figure 4:
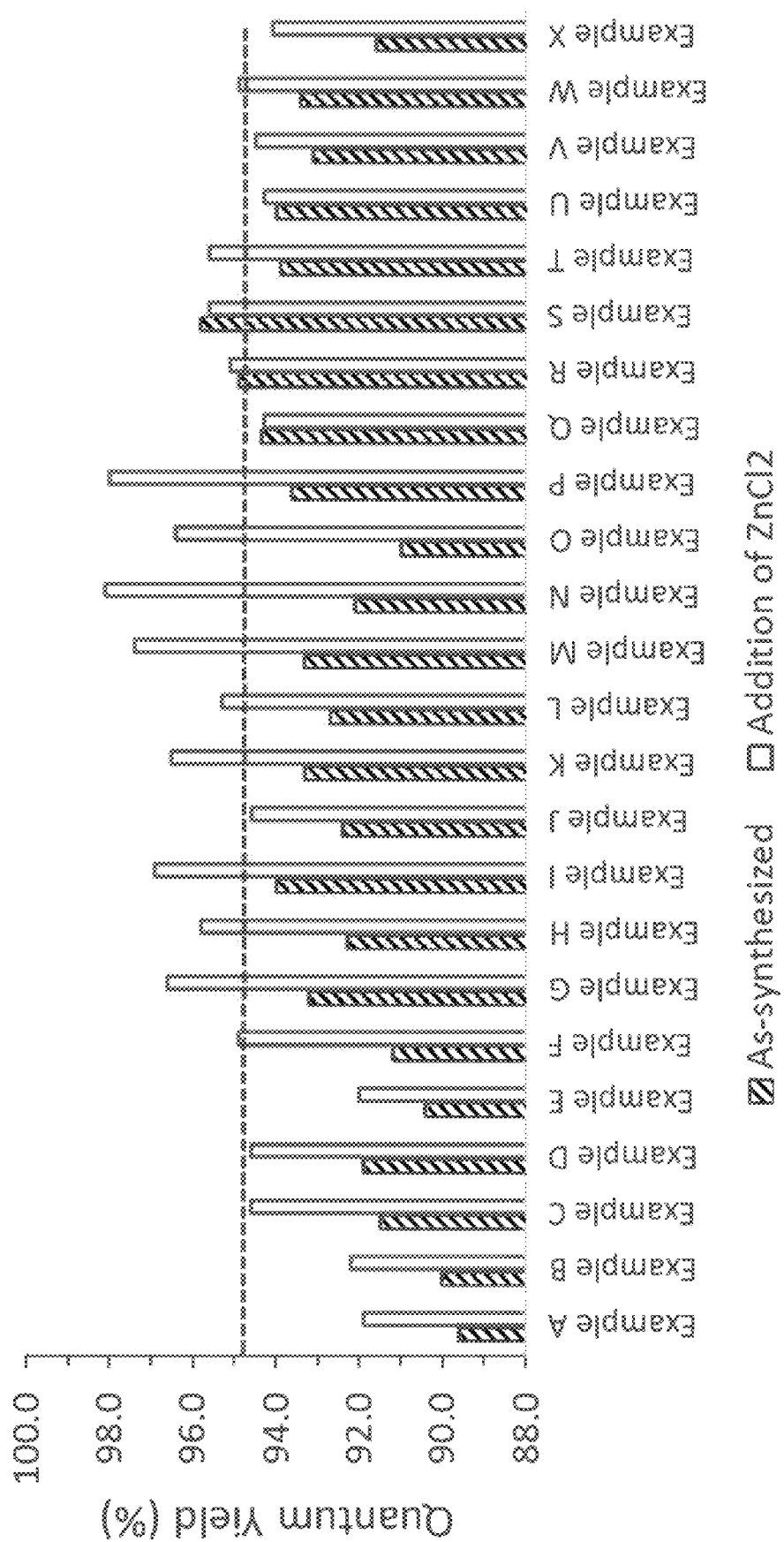
FIG. 4 is a bar graph of the PLQY of InP/ZnSe/ZnS quantum dot samples (Examples A-X) before (left bar) and after (right bar) the addition of $ZnCl_2$. The dotted line represents a quantum yield value of 95%.
Figure 5:
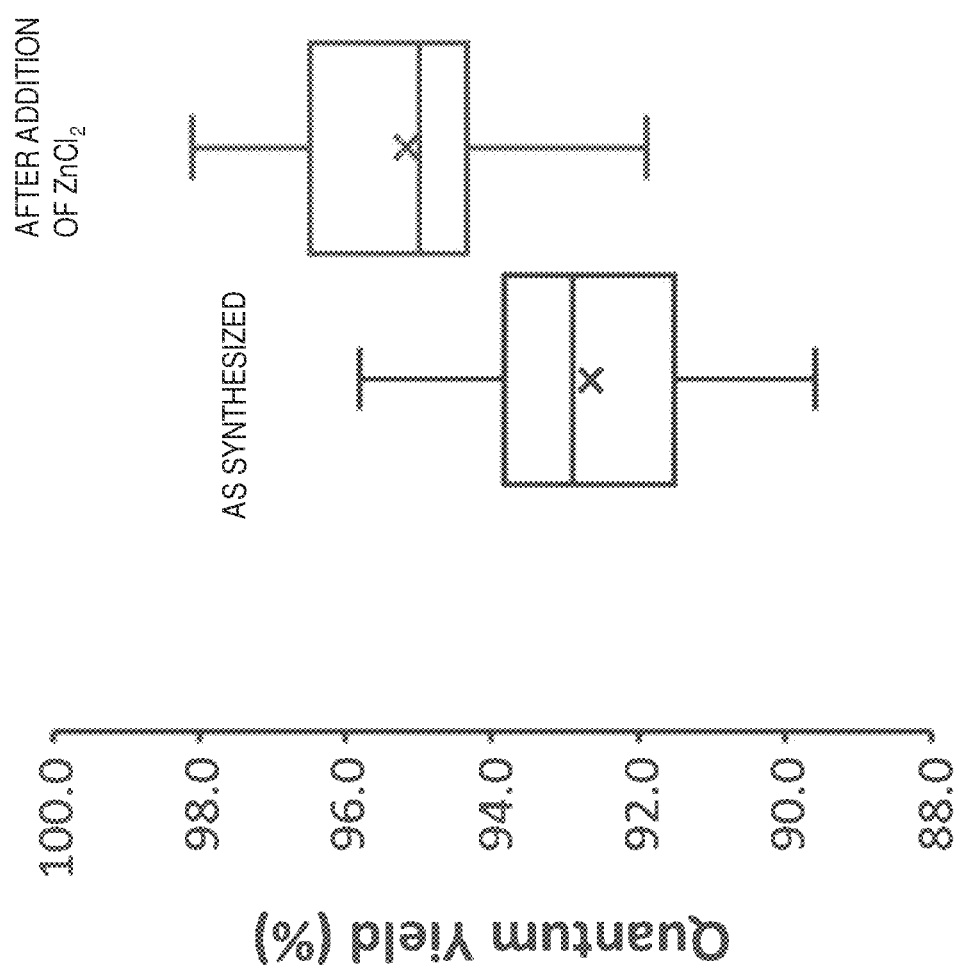
FIG. 5 is a box plot of the PLQY measurements for InP/ZnSe/ZnS quantum dot samples. The box on the left represents summarized data for purified quantum dot samples before the addition of $ZnCl_2$ and the box on the right represents summarized data after the addition of $ZnCl_2$.
Figure 6:
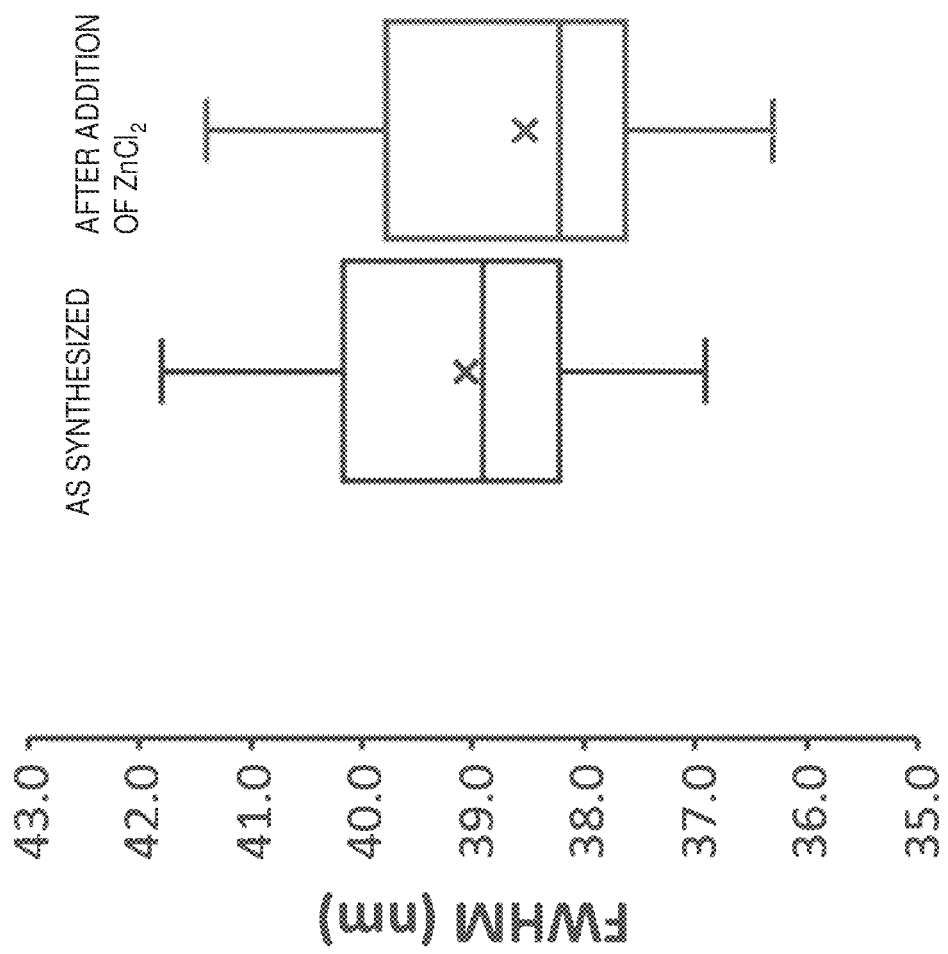
FIG. 6 is a box plot of the FWHM measurements for InP/ZnSe/ZnS quantum dot samples. The box on the left represents summarized data for purified quantum dot samples before the addition of $ZnCl_2$ and the box on the right represents summarized data after the addition of $ZnCl_2$.

The improvement in quantum yield realized upon the addition of $ZnCl_2$ was highly reproducible across quantum dot syntheses. As shown in FIG. 4, the average increase in quantum yield was +2.5% points ($\sigma=1.6\%$ points) following the addition of $ZnCl_2$. In addition to the increase in quantum yield, other optical changes include a slight blueshift of the emission wavelength (PWL) by −0.6 nm ($\sigma=0.3$ nm) as shown in FIG. 2 and a narrowing of the full width at half maximum (FWHM) by −0.5 nm ($\sigma=0.3$ nm) as shown in FIG. 3. Statistical summaries for the various samples before and after the addition of $ZnCl_2$ are shown in FIGS. 5-7.

Optical properties of InP/ZnSe/ZnS quantum dot samples (Examples A-X) before and after addition of $ZnCl_2$ are shown in TABLE 1.

TABLE 1

InP/ZnSe/ZnS optical properties before and after ZnCl₂ addition

| Example | PWL (nm) before addition | FWHM (nm) before addition | PLQY (%) before addition | PWL (nm) after addition | FWHM (nm) after addition | PLQY (%) after addition |
|---|---|---|---|---|---|---|
| A | 527.6 | 38.5 | 89.6 | 527.1 | 37.6 | 91.9 |
| B | 529.1 | 38.5 | 90.0 | 528.5 | 38.0 | 92.2 |
| C | 534.3 | 39.0 | 91.5 | 533.3 | 38.2 | 94.6 |
| D | 529.7 | 41.1 | 91.9 | 529.1 | 40.8 | 94.6 |
| E | 531.8 | 39.0 | 90.4 | 531.0 | 38.4 | 92.0 |
| F | 527.8 | 40.8 | 91.2 | 527.0 | 40.2 | 94.9 |
| G | 529.2 | 41.8 | 93.2 | 528.9 | 41.4 | 96.6 |
| H | 527.6 | 40.9 | 92.3 | 527.2 | 40.3 | 95.8 |
| I | 532.6 | 40.4 | 94.0 | 531.9 | 40.0 | 96.9 |
| J | 528.1 | 40.8 | 92.4 | 527.7 | 40.4 | 94.6 |
| K | 526.8 | 39.3 | 93.3 | 525.9 | 39.1 | 96.5 |
| L | 525.6 | 38.3 | 92.7 | 524.8 | 37.6 | 95.3 |
| M | 526.6 | 38.2 | 93.3 | 526.2 | 37.8 | 97.4 |
| N | 526.1 | 39.3 | 92.1 | 526.1 | 38.8 | 98.1 |
| O | 525.2 | 36.9 | 91.0 | 524.5 | 36.3 | 96.4 |
| P | 524.3 | 37.2 | 93.6 | 523.6 | 36.8 | 98.0 |
| Q | 524.3 | 37.4 | 94.4 | 524.4 | 37.3 | 94.3 |
| R | 526.1 | 37.3 | 94.9 | 526.2 | 37.3 | 95.1 |
| S | 526.0 | 38.0 | 95.8 | 525.8 | 37.7 | 95.6 |
| T | 528.9 | 38.7 | 93.9 | 527.8 | 37.8 | 95.6 |
| U | 528.4 | 38.8 | 94.0 | 528.1 | 38.4 | 94.3 |
| V | 525.0 | 39.1 | 93.1 | 524.5 | 38.2 | 94.5 |
| W | 525.4 | 38.6 | 93.4 | 524.6 | 37.7 | 94.9 |
| X | 525.7 | 39.5 | 91.6 | 524.7 | 38.5 | 94.1 |

Example 3

Addition of Other Metal Halides

Using the solutions prepared in Example 1, the metal halides shown in TABLE 2 were added to the solutions and the solubility, quantum yield (QY) of the concentrate, and the power conversion efficiency (PCE) of quantum dot photoresist (QDPR) films produced post-baking was measured. Measurements of the solubility of the metal halide in the quantum dot and PGMEA solution determined which salts interfered with colloidal stability or reacted with PGMEA. Measurements of the relative quantum yield of the PGMEA concentrate determined which salts quenched luminescence. And, measurements of the post-bake PCE of prepared QDPR films evaluated the performance relative to a control sample that was not treated with a metal halide.

TABLE 2

Metal Halide Treatments

| Metal Halide | Status | Solubility in QD/PGMEA | Relative QY (%) of PGMEA concentrate | Post-bake PCE in QDPR |
|---|---|---|---|---|
| ZnCl₂ | Improved PCE | Soluble | >10% increase | 5-10% higher PCE |
| MgBr₂ | Improved PCE | Low solubility | >10% increase | 1-4% higher PCE |
| ZnCl₄ | No improvement | Low solubility | No change | Unchanged PCE |
| ZnBr₂ | No improvement | Low solubility | >10% increase | 1-2% lower PCE |
| HfCl₄ | No improvement | Low solubility | >10% increase | 4% lower PCE |
| CsBr | Failed | Soluble | No change | 5% lower PCE |
| CsCl | Failed | Low solubility | 30% reduction | Not tested |
| InCl₃ | Failed | Soluble | 35% reduction | Not tested |
| AlCl₃ | Failed | Insoluble | Not tested | Not tested |
| CaCl₂ | Failed | Insoluble | Not tested | Not tested |
| GaCl₃ | Failed | Insoluble | Not tested | Not tested |
| MgCl₂ | Failed | Insoluble | Not tested | Not tested |
| SrCl₂ | Failed | Insoluble | Not tested | Not tested |
| TiBr₄ | Failed | Mixture turned red | Not tested | Not tested |
| YCl₃ | Failed | PGMEA solidified | Not tested | Not tested |

Having now fully described this invention, it will be understood by those of ordinary skill in the art that the same can be performed within a wide and equivalent range of conditions, formulations and other parameters without affecting the scope of the invention or any embodiment thereof. All patents, patent applications, and publications cited herein are fully incorporated by reference herein in their entirety.

What is claimed is:

1. A nanostructure composition comprising:
   (a) at least one population of nanostructures, the nanostructures comprising a nanocrystal core and at least one shell;
   (b) at least one metal halide bound to the surface of the nanostructures; and
   (c) at least one metal carboxylate bound to the surface of the nanostructures.

2. The nanostructure composition of claim 1, wherein the nanocrystal core is selected from the group consisting of Si, Ge, Sn, Se, Te, B, C, P, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $Al_2CO$, and combinations thereof.

3. The nanostructure composition of claim 1, wherein the nanocrystal core comprises InP.

4. The nanostructure composition of claim 1, wherein the nanostructures comprise two shells.

5. The nanostructure composition of claim 1, wherein at least one shell is selected from the group consisting of CdS, CdSe, CdO, CdTe, ZnS, ZnO, ZnSe, ZnTe, MgTe, GaAs, GaSb, GaN, HgO, HgS, HgSe, HgTe, InAs, InSb, InN, AlAs, AN, AlSb, AlS, PbS, PbO, PbSe, PbTe, MgO, MgS, MgSe, MgTe, CuCl, Ge, Si, and alloys thereof.

6. The nanostructure composition of claim 1, wherein at least one shell comprises ZnSe and at least one shell comprises ZnS.

7. The nanostructure composition of claim 1, wherein at least one metal halide is selected from the group consisting of LiF, NaF, KF, $BeF_2$, $MgF_2$, $CaF_2$, $SrF_2$, CuF, AgF, AuF, $ZnF_2$, $HgF_2$, $A_1F_3$, $GaF_3$, $InF_3$, $SnF_2$, $PbF_2$, LiCl, NaCl, KCl, $BeCl_2$, $MgCl_2$, $CaCl_2$), $SrCl_2$, CuCl, AgCl, $ZnCl_2$, $HgCl_2$, $AlCl_3$, $GaCl_3$, $InCl_3$, $SnCl_2$, $PBCl_2$, LiBr, NaBr, KBr, $BeBr_2$, $MgBr_2$, $CaBr_2$, $SrBr_2$, CuBr, AgBr, AuBr, $ZnBr_2$, $HgBr_2$, $AlBr_3$, $GaBr_3$, $InBr_3$, $SnBr_2$, $PbBr_2$, LiI, NaI, KI, $BeI_2$, $MgI_2$, $CaI_2$, $SrI_2$, CuI, AgI, AuI, $ZnI_2$, $HgI_2$, $AlI_3$, $GaI_3$, $InI_3$, $SnI_2$, and $PbI_2$.

8. The nanostructure composition of claim 1, wherein at least one metal halide is selected from the group consisting of $ZnF_2$, $ZnCl_2$, $ZnBr_2$, and $ZnI_2$.

9. The nanostructure composition of claim 1, wherein at least one metal carboxylate is selected from the group consisting of zinc oleate, zinc hexanoate, zinc laurate, zinc myristate, zinc palmitate, zinc stearate, and zinc PEG-carboxylate.

10. The nanostructure composition of claim 1, wherein the nanostructure composition can be stably stored at a temperature between about 30° C. and about 90° C. between about 3 months and 3 years.

11. The nanostructure composition of claim 1, wherein the nanostructure composition exhibits a full width at half maximum of between about 30 nm and about 45 nm.

12. The nanostructure composition of claim 1, wherein the nanostructures comprise a nanocrystal core comprising InP, at least one shell comprising ZnSe, at least one shell comprising ZnS, and at least one metal halide comprising $ZnCl_2$.

13. The nanostructure composition of claim 1, wherein the nanostructures are quantum dots.

14. A method of preparing the nanostructure composition of claim 1, the method comprising:
 (a) providing at least one population of nanostructures, wherein the nanostructures comprise a nanocrystal core and at least one shell;
 (b) admixing at least one metal carboxylate with the nanostructures of (a);
 (c) admixing at least one metal halide with the nanostructures of (b);
 to produce a nanostructure composition.

15. A nanostructure film comprising the nanostructure composition of claim 1.

16. The nanostructure film of claim 15, further comprising an organic resin.

17. The nanostructure film of claim 15, wherein the at least one organic resin is a thermosetting resin or a UV curable resin.

18. A molded article comprising the nanostructure film of claim 15.

19. The molded article of claim 18, wherein the molded article is a light emitting diode or a liquid crystal display.

* * * * *